(12) United States Patent
Todorokihara

(10) Patent No.: US 11,139,825 B2
(45) Date of Patent: Oct. 5, 2021

(54) FREQUENCY RATIO MEASUREMENT DEVICE

(71) Applicant: Seiko Epson Corporation, Tokyo (JP)

(72) Inventor: Masayoshi Todorokihara, Suwa (JP)

(73) Assignee: Seiko Epson Corporation

( * ) Notice: Subject to any disclaimer, the term of this patent is extended or adjusted under 35 U.S.C. 154(b) by 0 days.

(21) Appl. No.: 17/004,330

(22) Filed: Aug. 27, 2020

(65) Prior Publication Data

US 2021/0067170 A1 Mar. 4, 2021

(30) Foreign Application Priority Data

Aug. 30, 2019 (JP) .............................. JP2019-158229

(51) Int. Cl.
  *H03M 1/10* (2006.01)
  *H03M 3/00* (2006.01)
  *G01R 23/00* (2006.01)

(52) U.S. Cl.
  CPC ........ *H03M 3/3283* (2019.05); *G01R 23/005* (2013.01); *H03M 3/346* (2013.01); *H03M 3/372* (2013.01)

(58) Field of Classification Search
  CPC .... H03M 3/3283; H03M 3/346; H03M 3/372; H03M 1/10; H03M 1/1009;
  (Continued)

(56) References Cited

U.S. PATENT DOCUMENTS 5,475,718 A * 12/1995 Rosenkranz ............ H03L 7/085
                                                        327/147
6,795,002 B2 * 9/2004 Gupta ...................... H03M 3/48
                                                        341/143

(Continued)

FOREIGN PATENT DOCUMENTS

JP    2018-201142 A    12/2018
JP    2019-191067 A    10/2019

OTHER PUBLICATIONS

E. Atalla et al., "An All-Digital Sigma Delta Discriminator of Arbitrary Order", 2006 IEEE International Symposium on Circuits and Systems, ECE Department, Ain Shams University, Cairo, Egypt, pp. 4991-4994, 2006.

(Continued)

*Primary Examiner* — Jean B Jeanglaude
(74) *Attorney, Agent, or Firm* — Harness, Dickey & Pierce, P.L.C.

(57) ABSTRACT

A frequency ratio measurement device includes a counter section configured to count a time event of a first signal and output a count value obtained by multiplying the time event by $k_0$, a time to digital converter section configured to output a time digital value corresponding to a phase difference between the first signal and a second signal, a combiner section configured to output a combined value of the count value and the time digital value, a subtractor section configured to output a difference value between a first value based on the combined value and a second value, a quantizer section configured to compare a third value based on the difference value with a predetermined threshold to thereby output a quantized value obtained by quantizing the third value, and a feedback section configured to output, based on a time event of the second signal, the second value based on the quantized value. The frequency ratio measurement device outputs, based on the quantized value, a delta-sigma modulated signal corresponding to a frequency ratio of the first signal and the second signal.

8 Claims, 20 Drawing Sheets

(58) Field of Classification Search
CPC ......... H03M 1/10741; H03M 2201/63; H03M 3/38; H03M 1/12; G01R 23/005; G01R 23/10
USPC .................................................. 341/120, 143
See application file for complete search history.

(56) References Cited

U.S. PATENT DOCUMENTS

| | | | | |
|---|---|---|---|---|
| 7,358,881 | B2 * | 4/2008 | Melanson | H03M 7/3035 |
| | | | | 341/143 |
| 7,432,841 | B1 * | 10/2008 | Kinyua | H03M 3/414 |
| | | | | 341/143 |
| 2002/0021238 | A1 * | 2/2002 | Noro | H03M 3/322 |
| | | | | 341/143 |
| 2010/0328125 | A1 * | 12/2010 | Pagnanelli | H03M 3/468 |
| | | | | 341/143 |
| 2012/0127009 | A1 * | 5/2012 | Pagnanelli | H03M 3/468 |
| | | | | 341/143 |
| 2015/0091745 | A1 * | 4/2015 | Pagnanelli | H03M 3/468 |
| | | | | 341/143 |
| 2018/0343014 | A1 | 11/2018 | Todorokihara | |
| 2019/0334528 | A1 | 10/2019 | Todorokihara | |

OTHER PUBLICATIONS

Joey White, "Noise Shaping in Mash Delta-Sigma Converters", Hephaestus Audio, 2009 (4 pages).

* cited by examiner

FIG. 15

| PD | CLK edge No. | 0 | 1 | 2 | 3 | 4 | 5 | 6 | 7 | 8 | 9 | 10 | 11 | 12 |
|---|---|---|---|---|---|---|---|---|---|---|---|---|---|---|
| T × 0.5 | ST | 0 | 4 | 12 | 20 | 29 | 37 | 45 | 54 | 62 | 64 | 64 | 64 | 64 |
|  | TD | 0 | 4 | 16 | 36 | 65 | 102 | 147 | 201 | 263 | 327 | 391 | 455 | 519 |
| T × 0.7 | ST | 0 | 2 | 10 | 19 | 27 | 35 | 44 | 52 | 60 | 64 | 64 | 64 | 64 |
|  | TD | 0 | 2 | 12 | 31 | 58 | 93 | 137 | 189 | 249 | 313 | 377 | 441 | 505 |
| T × 1.7 | ST | 0 | 0 | 2 | 10 | 19 | 27 | 35 | 44 | 52 | 60 | 64 | 64 | 64 |
|  | TD | 0 | 0 | 2 | 12 | 31 | 58 | 93 | 137 | 189 | 249 | 313 | 377 | 441 |
| T × 2.7 | ST | 0 | 0 | 0 | 2 | 10 | 19 | 27 | 35 | 44 | 52 | 60 | 64 | 64 |
|  | TD | 0 | 0 | 0 | 2 | 12 | 31 | 58 | 93 | 137 | 189 | 249 | 313 | 377 |
| T × 3.7 | ST | 0 | 0 | 0 | 0 | 2 | 10 | 19 | 27 | 35 | 44 | 52 | 60 | 64 |
|  | TD | 0 | 0 | 0 | 0 | 2 | 12 | 31 | 58 | 93 | 137 | 189 | 249 | 313 |

FIG. 16

| PD | T × 0.5 | T × 0.7 | T × 1.7 | T × 2.7 | T × 3.7 |
|---|---|---|---|---|---|
| TD | 519 | 505 | 441 | 377 | 313 |
| ΔTD | – | –14 | –64 | –64 | –64 |

FIG. 17

| CTX | 15 | 16 | 17 | 18 | 19 | 20 | 21 | 22 | 23 | 24 | 25 | 26 | 27 |
|---|---|---|---|---|---|---|---|---|---|---|---|---|---|
| ST | 0 | 6 | 13 | 22 | 31 | 38 | 47 | 56 | 63 | 64 | 64 | 64 | 64 |
| TD | 0 | 6 | 19 | 41 | 72 | 110 | 157 | 213 | 276 | 340 | 404 | 468 | 532 |

FIG. 18

| CTX | 148 | 149 | 150 | 151 | 152 | 153 | 154 | 155 | 156 | 157 | 158 | 159 | 160 |
|---|---|---|---|---|---|---|---|---|---|---|---|---|---|
| ST | 0 | 4 | 12 | 20 | 29 | 37 | 45 | 54 | 62 | 64 | 64 | 64 | 64 |
| TD | 0 | 4 | 16 | 36 | 65 | 102 | 147 | 201 | 263 | 327 | 391 | 455 | 519 |

FIG. 19

| CTX | 281 | 282 | 283 | 284 | 285 | 286 | 287 | 288 | 289 | 290 | 291 | 292 | 293 |
|---|---|---|---|---|---|---|---|---|---|---|---|---|---|
| ST | 0 | 2 | 10 | 19 | 27 | 35 | 44 | 52 | 60 | 64 | 64 | 64 | 64 |
| TD | 0 | 2 | 12 | 31 | 58 | 93 | 137 | 189 | 249 | 313 | 377 | 441 | 505 |

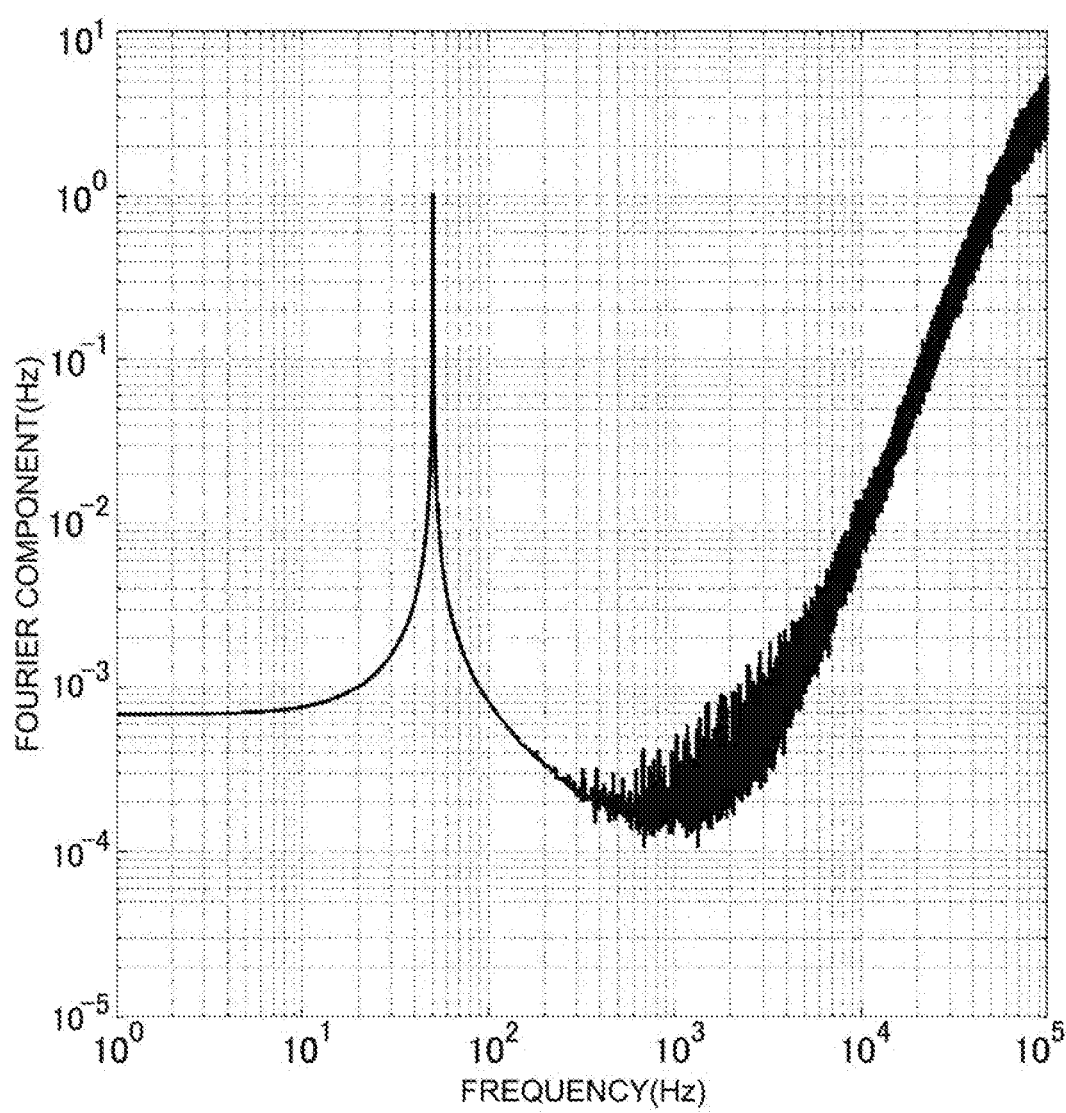

FREQUENCY RATIO MEASUREMENT DEVICE

The present application is based on, and claims priority from JP Application Serial Number 2019-158229, filed Aug. 30, 2019, the disclosure of which is hereby incorporated by reference herein in its entirety.

BACKGROUND

1. Technical Field

The present disclosure relates to a frequency ratio measurement device.

2. Related Art

E. Atalla, E. Hegazi, H. Sjoland, M. M. Ibrahim, "An all-digital Sigma Delta frequency discriminator of arbitrary order", 2006 IEEE International Symposium on Circuits and Systems, pp. 4991-4994, 2006 (Non Patent Literature 1) proposes a frequency synthesizer including a ΣΔ frequency discriminator. In order to generate, with the ΣΔ frequency discriminator, a digital bitstream, an average value of which is proportional to a frequency error between a signal RF output from a DCO (digitally controlled oscillator) and an external reference signal XREF, and control a frequency of the output signal RF, the frequency synthesizer supplies an error signal, which is a difference between an input frequency control word RFCW and the digital bitstream, to the DCO. The ΣΔ frequency discriminator respectively integrates an edge of a signal DIV obtained by dividing the input signal RF with a frequency divider and an edge of a reference signal REF obtained by synchronizing the external reference signal XREF with the signal RF and outputs a signal OUT obtained by quantizing a phase error obtained by a difference between the edges. Further, feedback is applied to reduce the phase error to zero by switching a division ratio of the frequency divider to N or N+1 according to the signal OUT.

The ΣΔ frequency discriminator described in Non Patent Literature 1 performs, according to a frequency ratio of an input signal and a reference signal, feedback-controls to reduce a phase error between a signal based on the input signal and the reference signal to zero. A mechanism for switching a division ratio and the like of the divider in order to reduce the phase error to zero is necessary.

SUMMARY

A frequency ratio measurement device according to an aspect of the present disclosure is a frequency ratio measurement device that outputs a delta-sigma modulated signal corresponding to a frequency ratio of a first signal and a second signal, the frequency ratio measurement device including a counter section, a time to digital converter section, a combiner section, a subtractor section, a quantizer section, and a feedback section. The counter section counts a time event of the first signal and outputs a count value obtained by multiplying the time event by $k_0$, where $k_0$ is a rational number. The time to digital converter section outputs a time digital value corresponding to a phase difference between the first signal and the second signal. The combiner section outputs a combined value of the count value and the time digital value. The subtractor section outputs a difference value between a first value based on the combined value and a second value output from the feedback section. The quantizer section compares a third value based on the difference value with a predetermined threshold to thereby output a quantized value obtained by quantizing the third value. The feedback section outputs, based on a time event of the second signal, the second value based on the quantized value. The delta-sigma modulated signal is a signal based on the quantized value.

In the frequency ratio measurement device according to the aspect, the first value may be the combined value, and the feedback section may multiply the quantized value by $k_1$, integrate the quantized value, and delay the quantized value and output the second value based on the time event of the second time, where $k_1$ is a positive number.

The frequency ratio measurement device according to the aspect may further include a differentiator section and an integrator section, the differentiator section may differentiate the combined value and output the first value based on the time event of the second signal, the integrator section may integrate the difference value and output the third value based on the time event of the second signal, and the feedback section may multiply the quantized value by $k_1$ and delay the quantized value and output the second value based on the time event of the second signal, where $k_1$ is a positive number.

In the frequency ratio measurement device according to the aspect, the subtractor section may be a first subtractor section, the difference value may be a first difference value, the frequency ratio measurement device may further include a second subtractor section and an integrator section, the first value may be the combined value, the feedback section may multiply the quantized value by $k_1$, integrate the quantized value, and delay the quantized value and output the second value based on the time event of the second signal, where $k_1$ is a positive number, and further multiply the quantized value by $k_2$ and delay the quantized value and output a fourth value based on the time event of the second signal, where $k_2$ is a positive number, the second subtractor section may output a second difference value between the first difference value and the fourth value, and the integrator section may integrate the second difference value and output the third value based on the time event of the second signal.

In the frequency ratio measurement device according to the aspect, the subtractor section may be a first subtractor section, the difference value may be a first difference value, the frequency ratio measurement device may further include a second subtractor section, a differentiator section, a first integrator section, and a second integrator section, the differentiator section may differentiate the combined value and output the first value based on the time event of the second signal, the feedback section may multiply the quantized value by $k_1$ and delay the quantized value and output the second value based on the time event of the second signal, where $k_1$ is a positive number, and further multiply the quantized value by $k_2$ and delay the quantized value and output a fourth value based on the time event of the second signal, where $k_2$ is a positive number, the first integrator section may integrate the first difference value and output an integrated value, the second subtractor section may output a second difference value between the integrated value and the fourth value, and the second integrator section may integrate the second difference value and output the third value based on the time event of the second signal.

In the frequency ratio measurement device according to the aspect, the quantizer section may be a first quantizer section, the quantized value may be a first quantized value, the frequency ratio measurement device may further include first to M-th feedforward sections, where M is a natural number, and a delta-sigma modulated signal generating section configured to generate the delta-sigma modulated signal, the j-th feedforward section may include a j+1-th quantizer section, where j is any integer equal to or large than 1 and equal to or smaller than M, and the j+1-th quantizer section may quantize a value based on an error that occurs in quantization by the j-th quantizer section and output a j+1-th quantized value, and the delta-sigma modulated signal generating section may generate the delta-sigma modulated signal based on the first to M+1-th quantized values.

In the frequency ratio measurement device according to the aspect, measurement resolution for the phase difference by the time to digital converter section and the threshold may be equal.

In the frequency ratio measurement device according to the aspect, measurement resolution for the phase difference by the time to digital converter section and the threshold may be different.

BRIEF DESCRIPTION OF THE DRAWINGS

FIG. 15 is a diagram showing a relation between a phase difference and a state value and a time digital value.

FIG. 16 is a diagram showing a relation between the phase difference and the time digital value.

FIG. 17 is a diagram showing a relation among a count value, the state value, and the time digital value.

FIG. 18 is a diagram showing a relation among the count value, the state value, and the time digital value.

FIG. 19 is a diagram showing a relation among the count value, the state value, and the time digital value.

FIG. 32 is a diagram showing an example of a frequency characteristic of a delta-sigma modulated signal in the fifth configuration example.

DESCRIPTION OF EXEMPLARY EMBODIMENTS

A preferred embodiment of the present disclosure is explained in detail below with reference to the drawings. The embodiment explained below does not unduly limit contents of the present disclosure described in the appended claims. Not all of components explained below are essential constituent elements of the present disclosure.

1. Basic Configuration of a Frequency Ratio Measurement Device

Figure 1:
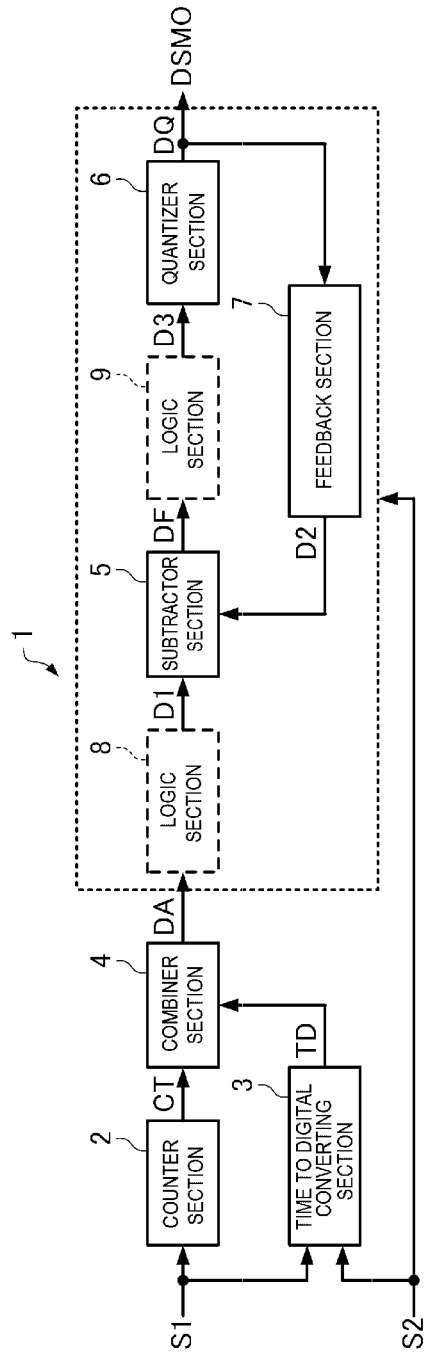
FIG. 1 is a diagram showing a basic configuration of a frequency ratio measurement device in an embodiment.

FIG. 1 is a diagram showing a basic configuration of a frequency ratio measurement device 1 in this embodiment. The frequency ratio measurement device 1 outputs a delta-sigma modulated signal DSMO corresponding to a frequency ratio of a first signal S1 and a second signal S2. As shown in FIG. 1, the frequency ratio measurement device 1 includes a counter section 2, a time to digital converter section 3, a combiner section 4, a subtractor section 5, a quantizer section 6, and a feedback section 7. The frequency ratio measurement device 1 may include a logic section 8 and a logic section 9.

The counter section 2 counts a time event of the first signal S1 and outputs a count value CT obtained by multiplying the time event by $k_0$, where $k_0$ is a rational number. The time event of the first signal S1 is timing when the first signal S1 changes. For example, the time event of the first signal S1 may be a rising edge or a falling edge of the first signal S1 or may be the rising edge and the falling edge of the first signal S1.

The time to digital converter section 3 outputs a time digital value TD corresponding to a phase difference between the first signal S1 and the second signal S2.

The combiner section 4 outputs a combined value DA of the count value CT and the time digital value TD. For example, the combined value DA may be a difference value between the count value CT and the time digital value TD or may be an added-up value of the count value CT and the time digital value TD.

The subtractor section 5 outputs a difference value DF between a first value D1 based on the combined value DA and a second value D2 output from the feedback section 7. The first value D1 may be the combined value DA itself or the logic section 8 may calculate the first value D1 based on the combined value DA.

The quantizer section 6 compares a third value D3 based on the difference value DF with a predetermined threshold to thereby output a quantized value DQ obtained by quantizing the third value D3. The third value D3 may be the difference value DF itself or the logic section 9 may calculate the third value D3 based on the difference value DF.

The feedback section 7 outputs, based on a time event of the second signal S2, a second value D2 based on the quantized value DQ. The time event of the second signal S2 is timing when the second signal S2 changes. For example, the time event of the second signal S2 may be a rising edge or a falling edge of the second signal S2 or may be the rising edge and the falling edge of the second signal S2.

The delta-sigma modulated signal DSMO is a signal based on the quantized value DQ.

In this way, the frequency ratio measurement device 1 in this embodiment combines the count value CT obtained by counting the time event of the first signal S1 and multiplying the time event by $k_0$ and the time digital value TD corresponding to the phase difference between the first signal S1 and the second signal S2 and outputs the quantized value DQ obtained by quantizing the third value D3 based on the difference value DF between the first value D1 based on the combined value DA and the second value D2. With the frequency ratio measurement device 1 in this embodiment, the second value D2 based on the quantized value DQ is fed back based on the time event of the second signal S2, whereby the delta-sigma modulated signal DSMO corresponding to the frequency ratio of the first signal S1 and the second signal S2 is obtained based on the quantized value DQ. Therefore, it is possible to measure the frequency ratio of the first signal S1 and the second signal S2 without requiring a switching mechanism for switching a division ratio and the like of a frequency divider.

With the frequency ratio measurement device 1 in this embodiment, unlike related art for indirectly measuring a frequency ratio of an input signal and a reference signal according to a switching ratio of the switching mechanism, it is possible to directly measure the frequency ratio of the first signal S1 and the second signal S2 and output the delta-sigma modulated signal DSMO indicating a measurement result.

Further, with the frequency ratio measurement device 1 in this embodiment, by using the combined value DA of the count value CT and the time digital value TD corresponding to the phase difference between the first signal S1 and the second signal S2, detection accuracy for the phase difference between the first signal S1 and the second signal S2 is improved and measurement resolution is improved. Therefore, it is possible to perform highly accurate frequency ratio measurement.

A specific configuration example of the frequency ratio measurement device 1 in this embodiment is explained in detail below. In the following explanation, a clock signal CLK is equivalent to the first signal S1 and a measured signal SIG is equivalent to the second signal S2. The frequency ratio measurement device 1 that measures a frequency ratio in a reciprocal count scheme for counting a time event of the clock signal CLK in synchronization with a time event of the measured signal SIG is explained as an example.

Figure 2:
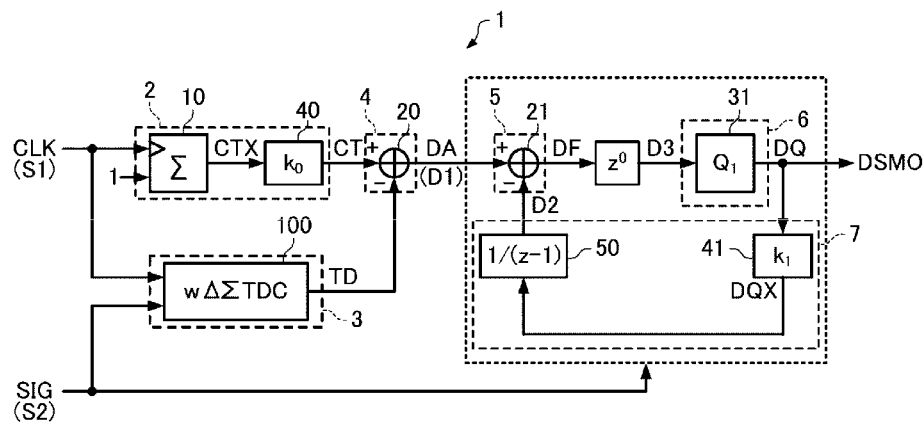
FIG. 2 is a diagram showing the frequency ratio measurement device in a first configuration example.

2. First Configuration Example 2-1. Configuration of the Frequency Ratio Measurement Device FIG. 2 is a diagram showing the frequency ratio measurement device 1 in a first configuration example. As shown in FIG. 2, the frequency ratio measurement device 1 in the first configuration example includes an accumulator 10, a subtractor 20, a subtractor 21, a quantizer 31, a gain element 40, a gain element 41, a delay integrator 50, and a time to digital converter 100 of a weighted ΔΣ count value accumulation type.

The accumulator 10 integrates 1 and outputs a count value CTX every time a time event of the clock signal CLK occurs. In other words, the accumulator 10 counts the time event of the clock signal CLK and outputs the count value CTX. The accumulator 10 counts, based on a not-shown control signal, the time event of the clock signal CLK in a predetermined period.

Figure 3:
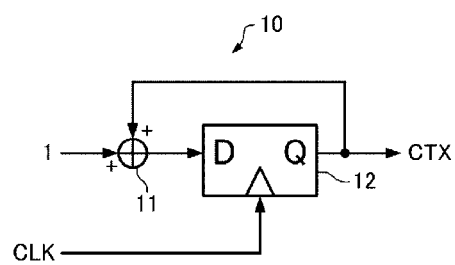
FIG. 3 is a diagram showing a specific configuration example of an accumulator.

FIG. 3 is a diagram showing a specific configuration example of the accumulator 10. As shown in FIG. 3, the accumulator 10 includes an adder 11 and a register 12. The register 12 is configured by, for example, one or a plurality of D-type flip flops. The adder 11 outputs a value obtained by adding 1 to the count value CTX retained by the register 12. The register 12 captures, in synchronization with the time event of the clock signal CLK, a value output from the adder 11 and retains the value as the count value CTX.

Referring back to FIG. 2, the gain element 40 outputs the count value CT obtained by multiplying the count value CTX by $k_0$, where $k_0$ is a rational number.

The time to digital converter 100 outputs a time digital value TD corresponding to a phase difference between the clock signal CLK and the measured signal SIG. Specifically, the time to digital converter 100 outputs the time digital value TD corresponding to a phase difference PD between the time event of the clock signal CLK, which is a reference, and the time event of the measured signal SIG. The time event of the clock signal CLK, which is the reference, may be, for example, a time event immediately preceding a time event in which the count value CTX changes from 0 to 1. In this embodiment, the time to digital converter 100 outputs the time digital value TD having a smaller value as the phase difference PD is larger. A detailed configuration of the time to digital converter 100 is explained below.

The subtractor 20 subtracts the time digital value TD from the count value CT and outputs the combined value DA.

The combined value DA output from the subtractor 20 is input to the subtractor 21 as the first value D1. The subtractor 21 subtracts, from the first value D1, the second value D2 output from the delay integrator 50 and outputs the difference value DF. The difference value DF output from the subtractor 21 is input to the quantizer 31 as the third value D3. In FIG. 2, in order to clearly indicate that the third value D3 input to the quantizer 31 is a discrete value, a value of which is updated based on the time event of the measured signal SIG, a notation "$z^0$" by z-transform is inserted between the subtractor 21 and the quantizer 31.

The quantizer 31 compares the third value D3 with a predetermined threshold $VT_1$ to thereby output a quantized value DQ obtained by quantizing the third value D3. In other words, the quantizer 31 outputs, as the quantized value DQ, a quotient obtained by dividing the third value D3, which is a dividend, by the threshold $VT_1$, which is a divisor.

The gain element 41 outputs a quantized value DQX obtained by multiplying the quantized value DQ by $k_1$, where $k_1$ is a positive number.

The delay integrator 50 integrates the quantized value DQX and delays the quantized value DQX and outputs the second value D2 based on the time event of the measured signal SIG. A notation of the delay integrator by the z-transform is "1/(z−1)".

Figure 4:
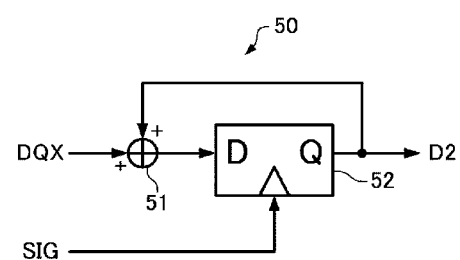
FIG. 4 is a diagram showing a specific configuration example of a delay integrator.

FIG. 4 is a diagram showing a specific configuration example of the delay integrator 50. As shown in FIG. 4, the delay integrator 50 includes an adder 51 and a register 52. The register 52 is configured by, for example, one or a plurality of D-type flip flops. The adder 51 outputs a value obtained by adding up the quantized value DQX and a value retained by the register 52. The register 52 captures, in synchronization with the time event of the measured signal SIG, the value output from the adder 51 and retains the value as the second value D2. In the example shown in FIG. 4, the delay integrator 50 integrates the quantized value DQX with the adder 51 and the register 52, delays the quantized value DQX in synchronization with the time event of the measured signal SIG, and outputs the second value D2.

In the frequency ratio measurement device 1 in the first configuration example configured as explained above, the quantized value DQ is equivalent to a quotient obtained by dividing the third value D3, which is a dividend, by the threshold $VT_1$, which is a divisor. Delta-sigma modulation is realized by treating a remainder as a phase. A time series of the quantized value DQ is the delta-sigma modulated signal DSMO corresponding to a frequency ratio of the clock signal CLK and the measured signal SIG. In the frequency ratio measurement device 1 in the first configuration example, the second value D2 based on the quantized value DQ is fed back. Therefore, the delta-sigma modulated signal DSMO, which is the time series of the quantized value DQ is a primary delta-sigma modulated signal.

In FIG. 2, the accumulator 10 and the gain element 40 are examples of a "counter section" and are equivalent to the counter section 2 shown in FIG. 1. The time to digital converter 100 is an example of a "time to digital converter section" and is equivalent to the time to digital converter section 3 shown in FIG. 1. The subtractor 20 is an example of a "combiner section" and is equivalent to the combiner section 4 shown in FIG. 1. The subtractor 21 is an example of a "subtractor section" and is equivalent to the subtractor section 5 shown in FIG. 1. The quantizer 31 is an example of a "quantizer section" and is equivalent to the quantizer section 6 shown in FIG. 1. The gain element 41 and the delay integrator 50 are examples of a "feedback section" and are equivalent to the feedback section 7 shown in FIG. 1.

The feedback section 7 only has to be configured to multiply the quantized value DQ by $k_1$, integrate the quantized value DQ, and delay the quantized value DQ and output the second value D2 based on the time event of the measured signal SIG. The order of the $k_1$ multiplication, the integration, and the delay is optional.

Figure 5:
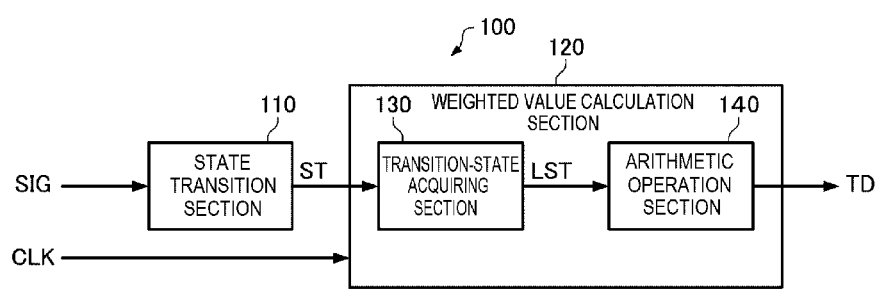
FIG. 5 is a diagram showing a configuration example of a time to digital converter of a weighted $\Delta\Sigma$ count value accumulation type.

2-2. Configuration of the Time to Digital Converter of the Weighted ΔΣ Count Value Accumulation Type FIG. 5 is a diagram showing a configuration example of the time to digital converter 100 of the weighted ΔΣ count value accumulation type. As shown in FIG. 5, the time to digital converter 100 includes a state transition section 110 and a weighted value calculation section 120.

The state transition section 110 starts transition of a state based on the measured signal SIG and outputs a state value ST indicating the state.

The weighted value calculation section 120 performs, on a value based on the state value ST, weighting corresponding to the number of time events of the clock signal CLK and performs predetermined operation to thereby generate the time digital value TD. The weighted value calculation section 120 may include a transition-state acquiring section 130 and an arithmetic operation section 140. The transition-state acquiring section 130 acquires and retains the state value ST and outputs a retained value as a state value LST every time a time event of the clock signal CLK occurs. The arithmetic operation section 140 performs, on the state value LST based on the state value ST, weighting corresponding to the number of time events of the clock signal CLK and performs predetermined operation to thereby generate the time digital value TD.

Figure 6:
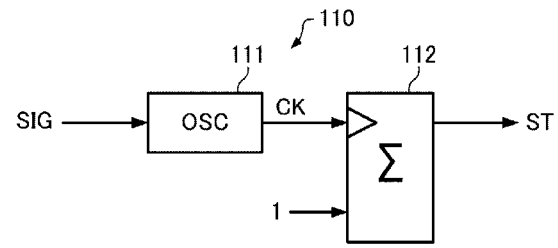
FIG. 6 is a diagram showing a configuration example of a state transition section.

FIG. 6 is a diagram showing a configuration example of the state transition section 110. As shown in FIG. 6, the state transition section 110 includes an oscillating section 111 and an accumulator 112.

The oscillating section 111 starts oscillation based on a time event of the measured signal SIG and outputs a clock signal CK including a predetermined number of pulses.

The accumulator 112 integrates 1 and outputs the state value ST every time a time event of the clock signal CK occurs. In other words, the accumulator 112 counts the time event of the clock signal CK and outputs the state value ST.

When it is considered that the state of the state transition section 110 transitions every time the time event of the clock signal CK occurs, the state value ST is equivalent to the number of state transitions of the state transition section 110.

Figure 7:
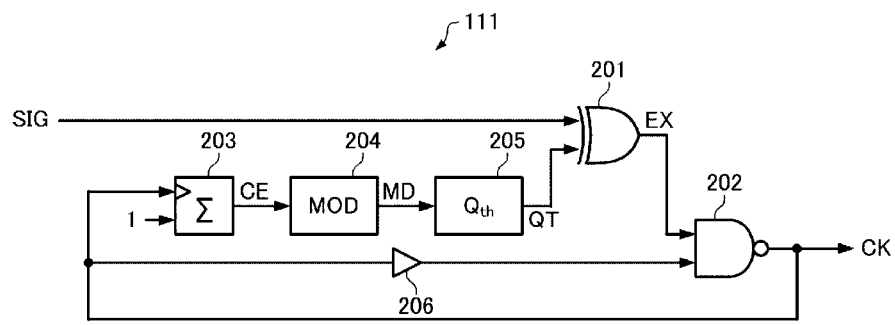
FIG. 7 is a diagram showing a configuration example of an oscillating section.

FIG. 7 is a diagram showing a configuration example of the oscillating section 111. As shown in FIG. 7, the oscillating section 111 includes an exclusive OR circuit 201, an inverted AND circuit 202, an accumulator 203, a modulo operator 204, a quantizer 205, and a buffer circuit 206.

The exclusive OR circuit 201 outputs an exclusive OR signal EX of the measured signal SIG and a quantized signal QT output from the quantizer 205. The exclusive OR signal EX is at a high level when a logical level of the measured signal SIG and a logical level of the quantized signal QT are different and is at a low level when the logical level of the measured signal SIG and the logical level of the quantized signal QT are the same.

The inverted AND circuit 202 outputs the clock signal CK, which is an inverted AND signal of the exclusive OR signal EX and an output signal of the buffer circuit 206. The clock signal CK is at the low level when both of the exclusive OR signal EX and the output signal of the buffer circuit 206 are at the high level and is at the high level when at least one of the exclusive OR signal EX and the output signal of the buffer circuit 206 is at the low level.

The accumulator 203 integrates 1 and outputs an integrated value CE every time a time event of the clock signal CK occurs. In other words, the accumulator 203 counts the time event of the clock signal CK and outputs the integrated value CE. The time event of the clock signal CK may be a rising edge or may be a falling edge or may be both of the rising edge and the falling edge.

The modulo operator 204 performs modulo operation with the integrated value CE as a dividend and with a predetermined value as a divisor. That is, the modulo operator 204 outputs a remainder value MD obtained by dividing the integrated value CE, which is the dividend, by the predetermined value, which is the divisor. The predetermined value, which is the divisor, is set as appropriate.

The quantizer 205 compares the remainder value MD with a predetermined threshold to thereby output the quantized signal QT obtained by quantizing the remainder value MD. In other words, the quantizer 205 outputs, as the quantized signal QT, a quotient obtained by dividing the remainder value MD, which is the dividend, by the threshold, which is the divisor.

The buffer circuit 206 outputs a signal obtained by buffering the clock signal CK. The output signal of the buffer circuit 206 is a signal obtained by delaying the clock signal CK.

Figure 8:
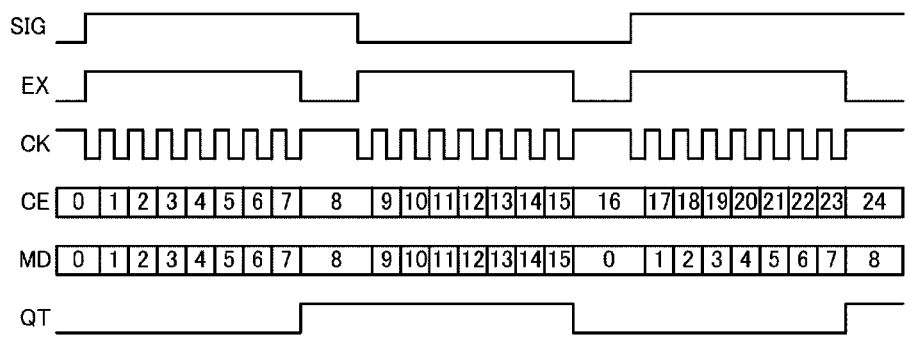
FIG. 8 is a flowchart showing an example of operation timing of the oscillating section.

FIG. 8 is a flowchart showing an example of operation timing of the oscillating section 111 shown in FIG. 7. FIG. 8 shows an example in which the divisor in the modulo operation by the modulo operator 204 is 16 and the threshold of the quantization by the quantizer 205 is 8.

In the example shown in FIG. 8, when the logical level of the measured signal SIG changes, the exclusive OR signal EX changes from the low level to the high level. A pulse of the clock signal CK is continuously generated in a period in which the exclusive OR signal EX is at the high level. The integrated value CE increases by 1 at every rising edge of the clock signal CK. The remainder value MD increases according to the increase in the integrated value CE and is initialized to 0 every time the integrated value CE reaches an integer time of 16. The quantized signal QT is at the low level when the remainder value MD is 7 or less and is at the high level when the remainder value MD is 8 or more. When the logical level of the quantized signal QT changes, the exclusive OR signal EX changes from the high level to the low level and the generation of the pulse of the clock signal CK stops.

In the example shown in FIG. 8, every time the logical level of the measured signal SIG changes, the oscillating section 111 oscillates eight times, the logical level of the clock signal CK is inverted sixteen times, and the pulse is generated eight times. However, if the divisor in the modulo operation by the modulo operator 204 and the threshold of the quantization by the quantizer 205 are changed, the number of times of oscillation of the oscillator 111 changes and the number of pulses of the clock signal CK also changes. For example, when the divisor in the modulo operation by the modulo operator 204 is 2 p and the threshold of the quantization by the quantizer 205 is p, every time the logical level of the measured signal SIG changes, the oscillating section 111 oscillates p times, the logical level of the clock signal CK is inverted 2 p times, and the pulse is generated p times. In this case, an upper limit value of the state value ST equivalent to the number of state transitions of the state transition section 110 is p.

Figure 9:
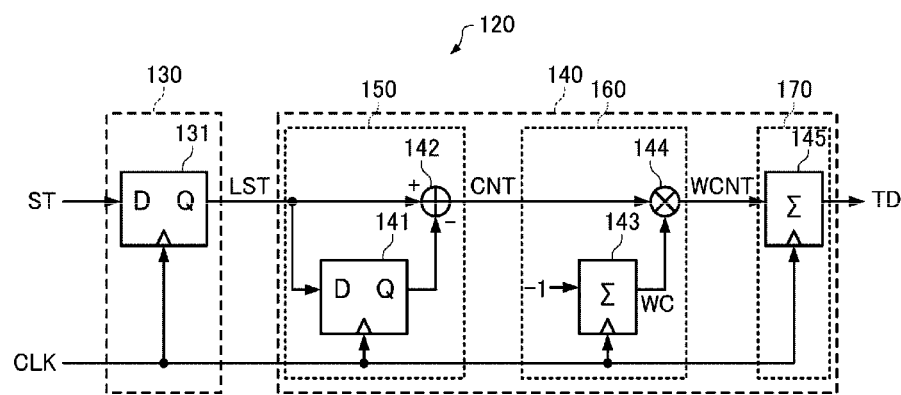
FIG. 9 is a diagram showing a configuration example of a weighted value calculation section.

FIG. 9 is a diagram showing a configuration example of the weighted value calculation section 120. As shown in FIG. 9, the weighted value calculation section 120 includes a register 131, a register 141, a subtractor 142, an accumulator 143, a multiplier 144, and an accumulator 145.

The register 131 captures the state value ST and retains the state value ST as the state value LST in synchronization with the time event of the clock signal CLK. The register 131 is configured by, for example, one or a plurality of D-type flip flops.

The register 141 captures and retains the state value LST in synchronization with the time event of the clock signal CLK. The register 141 is configured by, for example, one or a plurality of D-type flip flops.

The subtractor 142 subtracts a value retained by the register 141 from the state value LST and outputs a count value CNT. The count value CNT is equivalent to an increase in the state value LST between continuous two time events of the clock signal CLK. For example, if the time event of the clock signal CLK is a rising edge, the count value CNT is equivalent to the number of state transitions of the state transition section 110 in one cycle of the clock signal CLK.

In this way, the register 141 and the subtractor 142 configure a state-transition counter section 150 that counts the number of state transitions of the state transition section 110.

The accumulator 143 integrates −1 with an initial value and outputs a weighted coefficient value WC every time the time event of the clock signal CLK occurs. In other words, the accumulator 143 outputs the weight coefficient value WC that decreases by 1 from the initial value every time the time event of the clock signal CLK occurs. The initial value of the weight coefficient value WC is set as appropriate.

The multiplier 144 multiplies the count value CNT by the weight coefficient value WC and outputs a weighted count value WCNT.

In this way, the accumulator 143 and the multiplier 144 configure a weighting section 160 that weights the count value CNT according to the number of time events of the clock signal CLK.

The accumulator 145 integrates the weighted count value WCNT and outputs the time digital value TD every time the time event of the clock signal CLK occurs. In this way, the accumulator 145 configures an integrator section 170 that integrates the weighted count value WCNT.

The register 131 is equivalent to the transition-state acquiring section 130 shown in FIG. 5. The state-transition counter section 150, the weighting section 160, and the integrator section 170 are equivalent to the arithmetic operation section 140 shown in FIG. 5.

In the time to digital converter 100 configured as explained above, when an i-th count value CNT, that is, the number of state transitions of the state transition section 110 in i-th one cycle of the clock signal CLK is represented as $m_i$ and the weighted coefficient value WC in the i-th one cycle of the clock signal CLK is represented as $w_i$, the time digital value TD after N cycles of the clock signal CLK is represented by the following Expression (1).

$$TD = \sum_{i=1}^{N} w_i \cdot m_i \qquad (1)$$

The time digital value TD is a value corresponding to the phase difference PD between the time event of the clock signal CLK, which is a reference, and the time event of the measured signal SIG.

Figure 10:
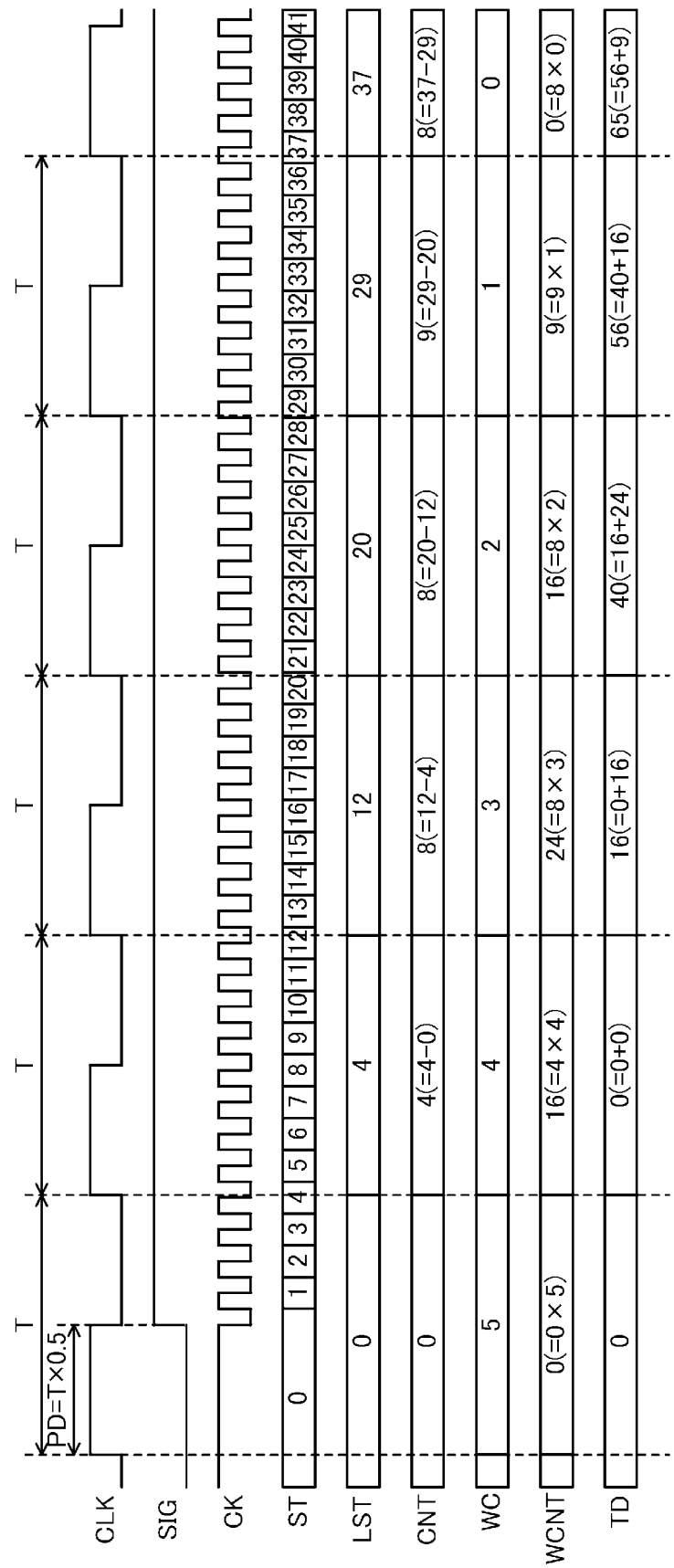
FIG. 10 is a flowchart showing an example of operation timing of the time to digital converter.
Figure 11:
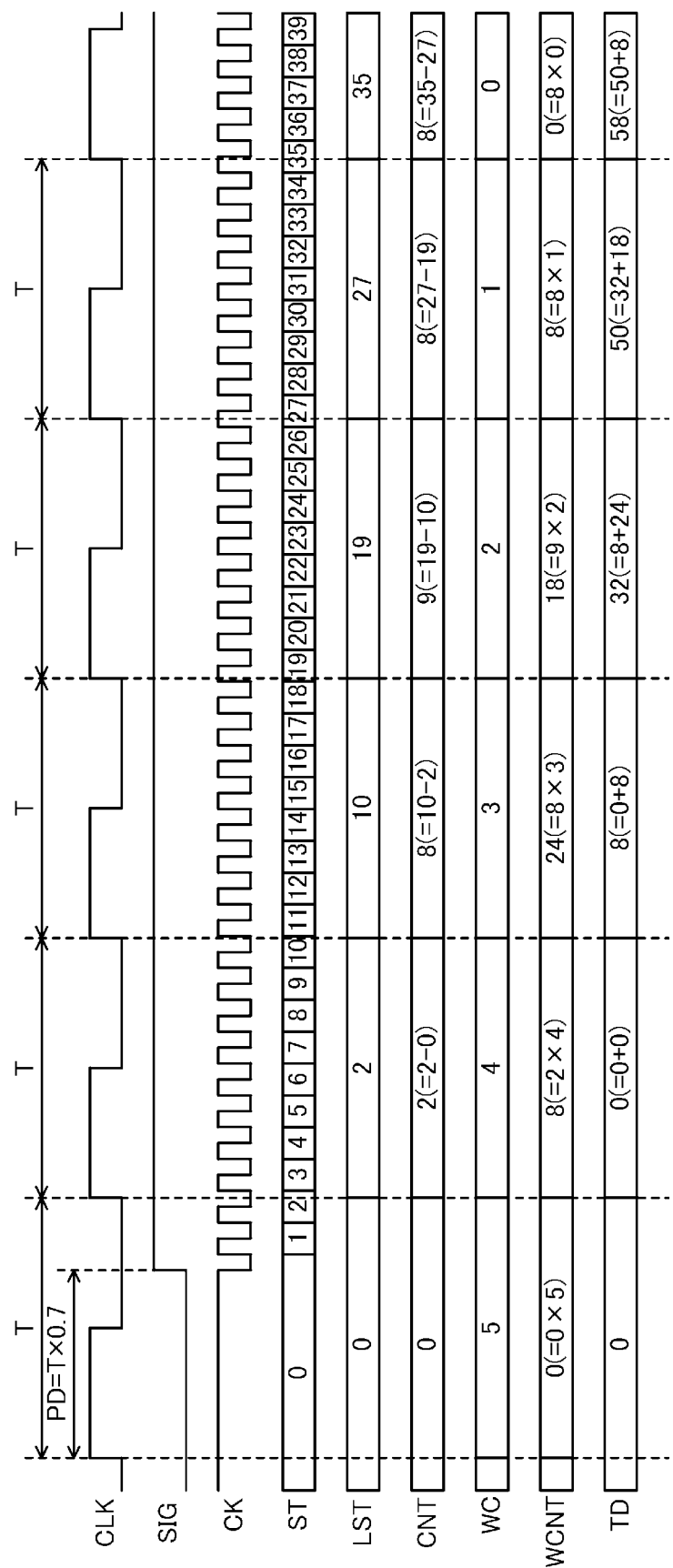
FIG. 11 is a flowchart showing an example of operation timing of the time to digital converter.

FIGS. 10 and 11 are flowcharts showing examples of operation timing of the time to digital converter 100. In FIGS. 10 and 11, the time event of the clock signal CLK is a rising edge. With respect to the time T of one cycle of the clock signal CLK, the phase difference PD between the time event of the clock signal CLK, which is the reference, and the time event of the measured signal SIG is T×0.5 in the example shown in FIG. 10 and is T×0.7 in the example shown in FIG. 11. In the example shown in FIG. 10, when the time event of the measured signal SIG occurs, every time the time event of the clock signal CLK occurs, the time digital value TD increases to 0, 16, 40, 56, 65. In the example shown in FIG. 11, when the time event of the measured signal SIG occurs, every time the time event of the clock signal CLK occurs, the time digital value TD increases to 0, 8, 32, 50, 58. When FIG. 10 and FIG. 11 are compared, the time digital value TD in the example shown in FIG. 11 in which the phase difference PD is large is a smaller value than the time digital value TD in the example shown in FIG. 10 in which the phase difference PD is smaller. That is, the time to digital converter 100 outputs the time digital value TD that has a smaller value as the phase difference PD is larger.

Although not shown in FIGS. 6 and 9, at predetermined timing until the logical level of the measured signal SIG changes next time after the state value ST reaches the upper limit value, the state value ST and the time digital value TD are reset to 0.

Figure 12:
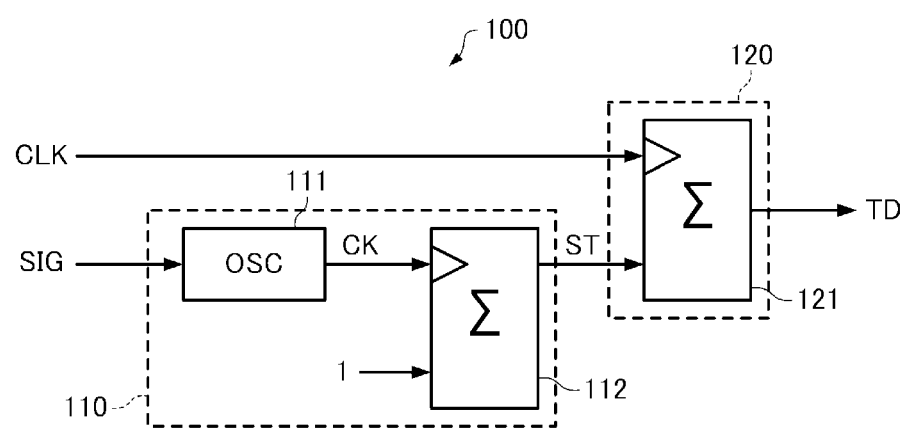
FIG. 12 is a diagram showing the configuration of a time to digital converter in a modification.

2-3. The Time to Digital Converter of the Weighted ΔΣ Count Value Accumulation Type in a Modification FIG. 12 is a diagram showing the configuration of the time to digital converter 100 shown in FIGS. 5, 6, and 9 in a modification.

The time to digital converter 100 shown in FIG. includes the oscillating section 111, the accumulator 112, and an accumulator 121.

The oscillating section 111 starts oscillation based on the time event of the measured signal SIG and outputs the clock signal CK including the predetermined number of pulses. The oscillating section 111 has, for example, the same configuration as the configuration shown in FIG. 7.

The accumulator 112 integrates 1 and outputs the state value ST every time the time event of the clock signal CK occurs. In other words, the accumulator 112 counts the time event of the clock signal CK and outputs the state value ST. As explained above, the state value ST is equivalent to the number of state transitions of the state transition section 110.

The accumulator 121 integrates the state value ST and outputs the time digital value TD every time the time event of the clock signal CK occurs. The time digital value TD is equivalent to an integrated value of the number of state transitions of the state transition section 110.

The oscillating section 111 and the accumulator 112 are equivalent to the state transition section 110 shown in FIG. 5. The accumulator 112 is equivalent to the weighted value calculation section 120 shown in FIG. 5.

In the time to digital converter 100 configured as explained above, the state value ST after i cycles of the clock signal CLK, that is, an integrated value Mi of the number of state transitions of the state transition section 110 in first to i-th cycles of the clock signal CLK is represented by the following Expression (2).

$$M_i = \sum_{j=1}^{i} m_j \quad (2)$$

Therefore, the time digital value TD after N cycles of the clock signal CLK is represented by the following Expression (3).

$$TD = \sum_{i=1}^{N} M_i \quad (3)$$

When Expression (2) is substituted in Expression (3), the following Expression (4) is obtained.

$$TD = \sum_{i=1}^{N} \sum_{j=1}^{i} m_j = \sum_{i=1}^{N} (N + 1 - i) \cdot m_i \quad (4)$$

When Expression (4) is compared with Expression (1), $N+1-i$ is equivalent to a weight coefficient value $w_i$ in i-th one cycle of the clock signal CLK. Therefore, the time digital value TD generated by the time to digital converter 100 shown in FIG. 12 is the same as the time digital value TD of the time to digital converter 100 shown in FIGS. 5, 6, and 9 and is a value corresponding to the phase difference PD between the time event of the clock signal CLK, which is the reference, and the time event of the measured signal SIG.

Figure 13:
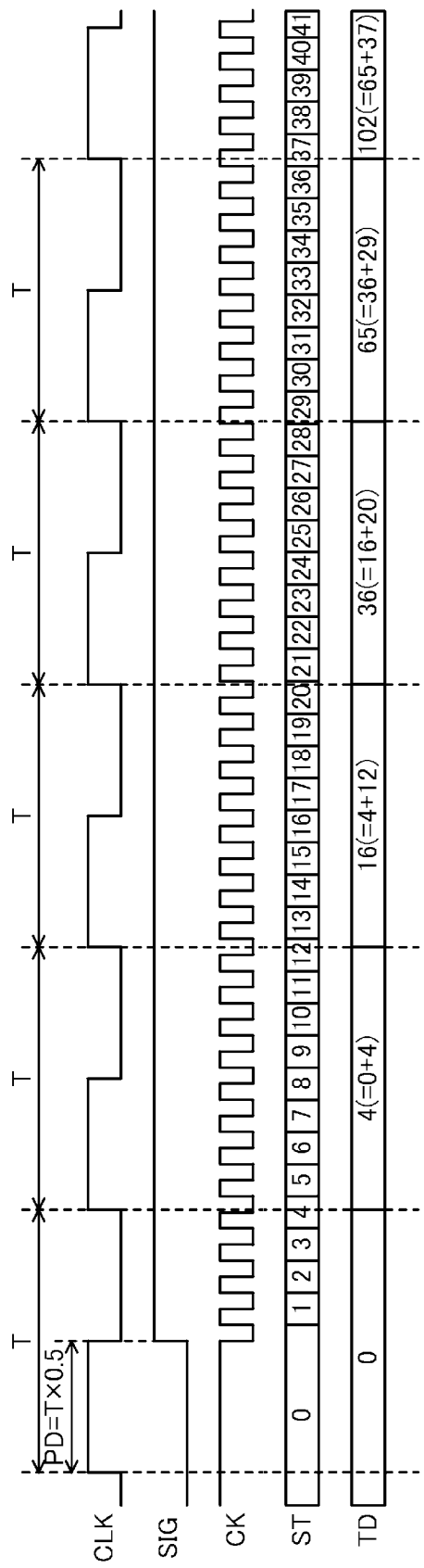
FIG. 13 is a flowchart showing an example of operation timing of the time to digital converter in the modification.
Figure 14:
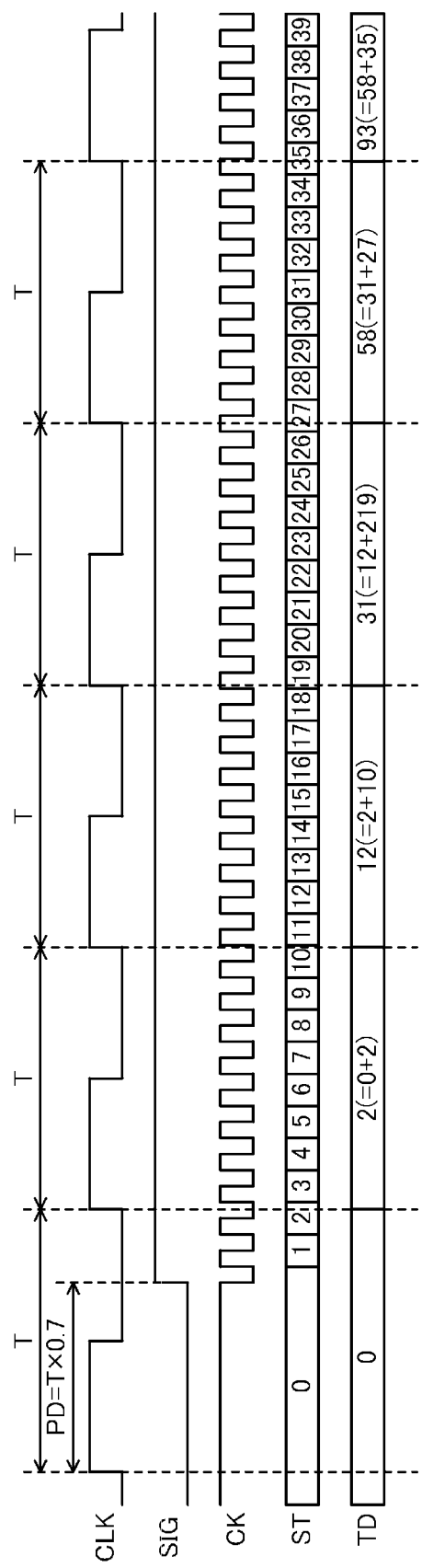
FIG. 14 is a flowchart showing an example of operation timing of the time to digital converter in the modification.

FIGS. 13 and 14 are flowcharts showing examples of operation timing of the time to digital converter 100 shown in FIG. 12. In FIGS. 13 and 14, the time event of the clock signal CLK is a rising edge. With respect to the time T of one cycle of the clock signal CLK, the phase difference PD between the time event of the clock signal CLK, which is the reference, and the time event of the measured signal SIG is T×0.5 in the example shown in FIG. 13 and is T×0.7 in the example shown in FIG. 14. In the example shown in FIG. 13, when the time event of the measured signal SIG occurs, every time the time event of the clock signal CLK occurs, the time digital value TD increases to 4, 16, 36, 65, 102. In the example shown in FIG. 14, when the time event of the measured signal SIG occurs, every time the time event of the clock signal CLK occurs, the time digital value TD increases to 2, 12, 31, 58, 93. When FIG. 13 and FIG. 14 are compared, the time digital value TD in the example shown in FIG. 14 in which the phase difference PD is larger is a value smaller than the time digital value TD in the example shown in FIG. 13 in which the phase difference PD is smaller. That is, the time to digital converter 100 shown in FIG. 12 outputs the time digital value TD, which is a smaller value as the phase difference PD is larger, like the time to digital converter 100 shown in FIGS. 5, 6, and 9.

Although not shown in FIG. 12, at predetermined timing until the logical level of the measured signal SIG changes next time after the state value ST reaches the upper limit value, the state value ST and the time digital value TD are reset to 0.

FIG. 15 is a diagram showing a relation between the phase difference PD and the state value ST and the time digital value TD. In FIG. 15, the upper limit value of the state value ST is 64. As shown in FIG. 15, every time the time event of the clock signal CLK occurs, the state value ST is integrated and the time digital value TD increases. When the time event of the clock signal CLK, which is the reference, is set to a zero-th rising edge, the state value ST reaches 64, which is the upper limit value, at a ninth rising edge when the phase difference PD is T×0.5 and T×0.7. The state value ST reaches 64, which is the upper limit value, respectively at tenth, eleventh, and twelfth rising edges when the phase difference PD is T×1.7, T×2, and T×3.7.

FIG. 16 is a diagram showing a relation between the phase difference PD and the time digital value TD obtained at a twelfth rising edge after the state value ST reaches the upper limit value in FIG. 15. The time digital values TD at the time when the phase difference PD is T×0.5, T×0.7, T×1.7, T×2.7, and T×3.7 are respectively 519, 505, 441, 377, and 313.

Difference values OTD of the time digital values TD are respectively −14, −64, −64, and −64. That is, since the state value ST reaches 64, which is the upper limit value, later as the phase difference PD is larger, the time digital value TD is a smaller value. When the phase difference PD increases by the time T of one cycle of the clock signal CLK, the time digital value TD decreases by 64, which is the upper limit value of the state value ST.

2-4. Relation Between a Combined Value and a Frequency Ratio

FIGS. 17, 18, and 19 are diagrams showing relations among the count value CTX, the state value ST, and the time digital value TD in the frequency ratio measurement device 1 using the time to digital converter 100 shown in FIG. 12. FIGS. 17, 18, and 19 show examples in which, in the oscillating section 111, the divisor in the modulo operation by the modulo operator 204 is 128 and the threshold of the quantization by the quantizer 205 is 64, that is, the oscillating section 111 oscillates sixty-four times every time the logical level of the measured signal SIG changes and the upper limit value of the state value ST is 64. In the examples shown in FIGS. 17, 18, and 19, at predetermine timing until the logical level of the measured signal SIG changes next time after the state value ST reaches 64, which is the upper limit value, the state value ST and the time digital value TD are reset to 0.

FIG. 17 shows a relation among the count value CTX, the state value ST, and the time digital value TD at the time when the measured signal SIG changes from the low level to the high level first. FIG. 18 shows a relation among the count value CTX, the state value ST, and the time digital value TD at the time when the measured signal SIG changes from the high level to the low level next. Further, FIG. 19 shows a relation among the count value CTX, the state value ST, and the time digital value TD at the time when the measured signal SIG changes from the low level to the high level next.

In FIGS. 17, 18, and 19, columns indicate values of the count value CTX, the state value ST, and the time digital value TD after the rising edge, which is the time event of the clock signal CLK. For example, in FIG. 17, a first column indicates that, after a fifteenth rising edge from when the accumulator 10 starts counting of the time event of the clock signal CLK, the count value CTX is 15 and the state value ST and the time digital value TD are 0.

As shown in FIG. 17, when the count value CTX is 15, the measured signal SIG changes from the low level to the high level first and the state value ST increases from 0. After a twenty-fourth rising edge of the clock signal CLK, the state value ST is 64, which is the upper limit value. At every rising edge of the clock signal CLK, the state value ST is integrated and the time digital value TD increases. The time digital value TD is 532 after a twenty-seventh rising edge of the clock signal CLK, that is, a twelfth rising edge counted from the fifteenth rising edge. 532 is a value corresponding to a phase difference PD1 between the fifteenth rising edge of the clock signal CLK and a rising edge of the measured signal SIG.

Subsequently, as shown in FIG. 18, the measured signal SIG changes from the high level to the low level next when the count value CTX is 148 and the state value ST increases from 0. After a one hundred fifty-seventh rising edge of the clock signal CLK, the state value ST is 64, which is the upper limit value. At every rising edge of the clock signal CLK, the state value ST is integrated and the time digital value TD increases. The time digital value TD is 519 after a one hundred sixtieth rising edge of the clock signal CLK, that is, a twelfth rising edge counted from a one hundred forty-eighth rising edge. 519 is a value corresponding to a phase difference PD2 between the one hundred forty-eighth rising edge of the clock signal CLK and a falling edge of the measured signal SIG.

Subsequently, as shown in FIG. 19, when the count value CTX is 281, the measured signal SIG changes from the low level to the high level next and the state value ST increases from 0. After a two hundred ninetieth rising edge of the clock signal CLK, the state value ST is 64, which is the upper limit value. At every rising edge of the clock signal CLK, the state value ST is integrated and the time digital value TD increases. The time digital value TD is 505 after a two hundred ninety-third rising edge of the clock signal CLK, that is, a twelfth rising edge counted from a two hundred eighty-first rising edge. 505 is a value corresponding to a phase difference PD3 between the two hundred eighty-first rising edge of the clock signal CLK and the rising edge of the measured signal SIG.

As shown in FIGS. 17, 18 and 19, after the state value ST reaches 64, which is the upper limit value, the time digital value TD increases by 64, which is the upper limit value of the state value ST, at every rising edge of the clock signal CLK. Therefore, 13, which is a difference between 532, which is the time digital value TD after the twenty-seventh rising edge of the clock signal CLK, and 519, which is the time digital value TD after the one hundred sixtieth rising edge of the clock signal CLK, means that a time difference between the phase difference PD1 and the phase difference PD2 is T×13/64 with respect to the time T of one cycle of the clock signal CLK. Similarly, 14, which is a difference between 519, which is the time digital value TD after the one hundred sixtieth rising edge of the clock signal CLK, and 505, which is the time digital value TD after the two hundred ninety-third rising edge of the clock signal CLK, means that a time difference between the phase difference PD2 and the phase difference PD3 is T×14/64.

When the gain $k_0$ of the gain element 40 is set to 64 like the upper limit value of the state value ST, the count value CT at the time when the count value CTX is 27 is 27×64=1728, the count value CT at the time when the count value CTX is 160 is 160×64=10240, and the count value CT at the time when the count value CTX is 293 is 293×64=18752. Since the combined value DA is a value obtained by subtracting the time digital value TD from the count value CT, the combined value DA at the time when the count value CTX is 27 is 1728−532=1196, the combined value DA at the time when the count value CTX is 160 is 10240−519=9721, and the combined value DA at the time when the count value CTX is 293 is 18752−505=18247.

A value (9721−1196)/64=133.203125 obtained by dividing, by the upper limit value of the state value ST, a difference between the combined value DA at the time when the count value CTX is 160 and the combined value DA at the time when the count value CTX is 27 represents a ratio of a time of a half cycle from the rising edge to the falling edge of the measured signal SIG and the time T of one cycle of the clock signal CLK. Similarly, a value (18247−9721)/64=133.21875 obtained by dividing, by the upper limit value of the state value ST, a difference between the combined value DA at the time when the count value CTX is 293 and the combined value DA at the time when the count value CTX is 160 represents a ratio of a time of a half cycle from the falling edge to the rising edge of the measured signal SIG and the time T of one cycle of the clock signal CLK. Therefore, the delta-sigma modulated signal DSMO obtained based on the combined value DA includes information concerning a frequency ratio of the clock signal CLK and the measured signal SIG.

Both of a time in which the count value CTX changes from 15 to 148 and a time in which the count value CTX changes from 148 to 281 are a time of 133 cycles of the clock signal CLK, that is, T×133. Therefore, the combined value DA also includes information concerning a phase difference between the clock signal CLK and the measured signal SIG and the delta-sigma modulated signal DSMO includes more accurate information concerning a frequency ratio of the clock signal CLK and the measured signal SIG.

2-5. Action Effects

The frequency ratio measurement device 1 in the first configuration example explained above quantizes, at every one cycle of the measured signal SIG, the third value D3, which is the difference value DF between the first value D1, which is the combined value DA of the count value CT obtained by integrating the time event of the clock signal CLK and multiplying the time event by $k_0$ and the time digital value TD corresponding to the phase difference between the clock signal CLK and the measured signal SIG, and the second value D2 and outputs the quantized value DQ. The count value CT increases by $k_0$ every time the time event of the clock signal CLK occurs. The combined value DA changes according to the count value CT and the time digital value TD. On the other hand, the second value D2 is a value obtained by, every time the time event of the measured signal SIG occurs, integrating the quantized value DQX obtained by multiplying the quantized value DQ by $k_1$. Accordingly, the third value D3, which is the difference value DF between the first value D1 and the second value D2, includes information concerning a frequency ratio of the clock signal CLK and the measured signal SIG and also includes information concerning a phase difference between the time event of the clock signal CLK and the time event of the measured signal SIG. A time series of the quantized value DQ is generated while sequentially feeding back the information concerning the phase difference to the next quantization. Therefore, with the frequency ratio measurement device 1 in the first configuration example, it is possible to highly accurately measure the frequency ratio of the clock signal CLK and the measured signal SIG while feeding back the information concerning the phase difference between the time event of the clock signal CLK and the time event of the measured signal SIG.

With the frequency ratio measurement device 1 in the first configuration example, since the accumulator 10 and the delay integrator 50 operate without a dead period without being reset, the quantization error is fed back to the third value D3 without being lost every time the time event of the measured signal SIG occurs. Therefore, a high noise shaping effect by delta-sigma modulation is exerted. Frequency measurement with a high S/N ratio can be performed.

Figure 20:
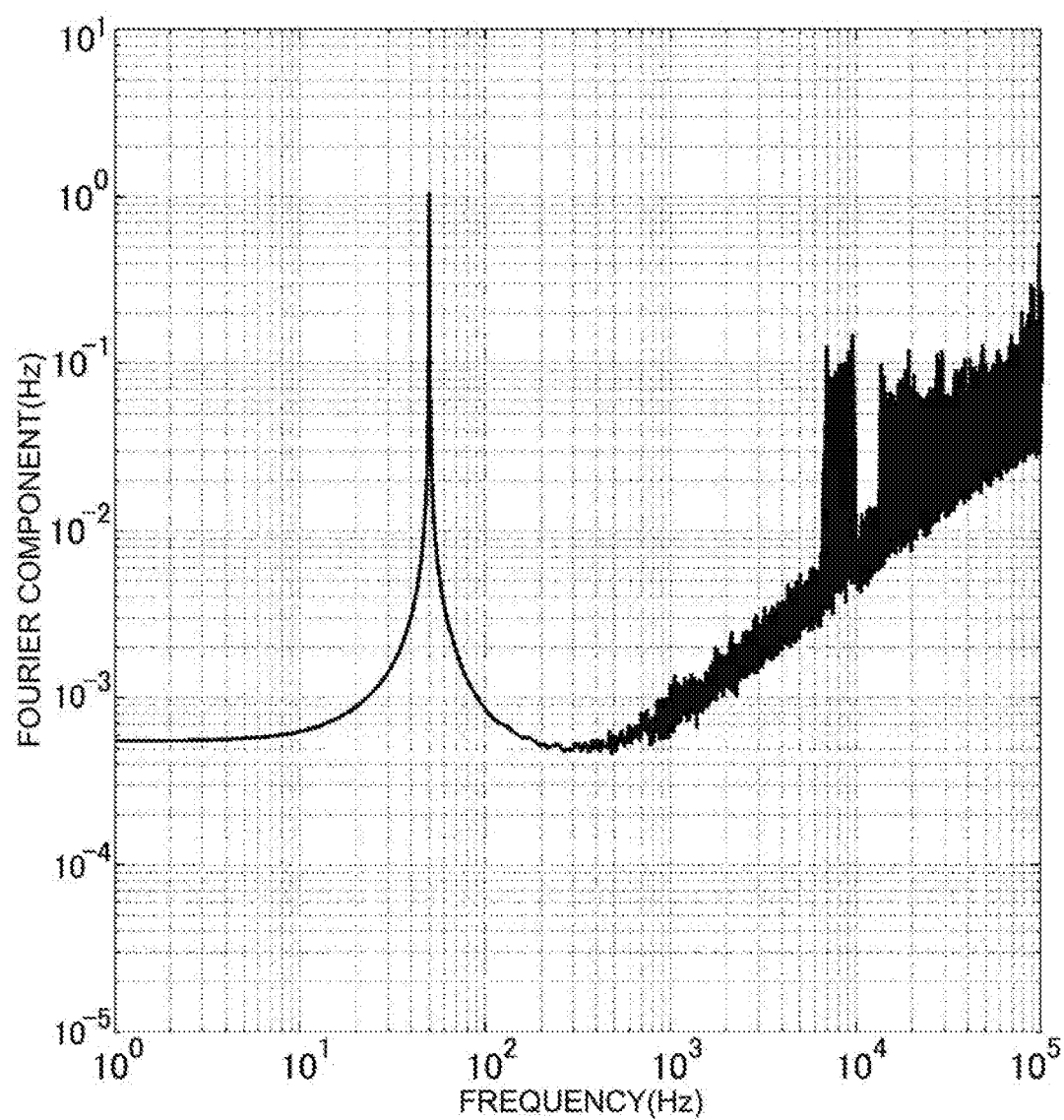
FIG. 20 is a diagram showing an example of a frequency characteristic of a delta-sigma modulated signal in the first configuration example.
Figure 21:
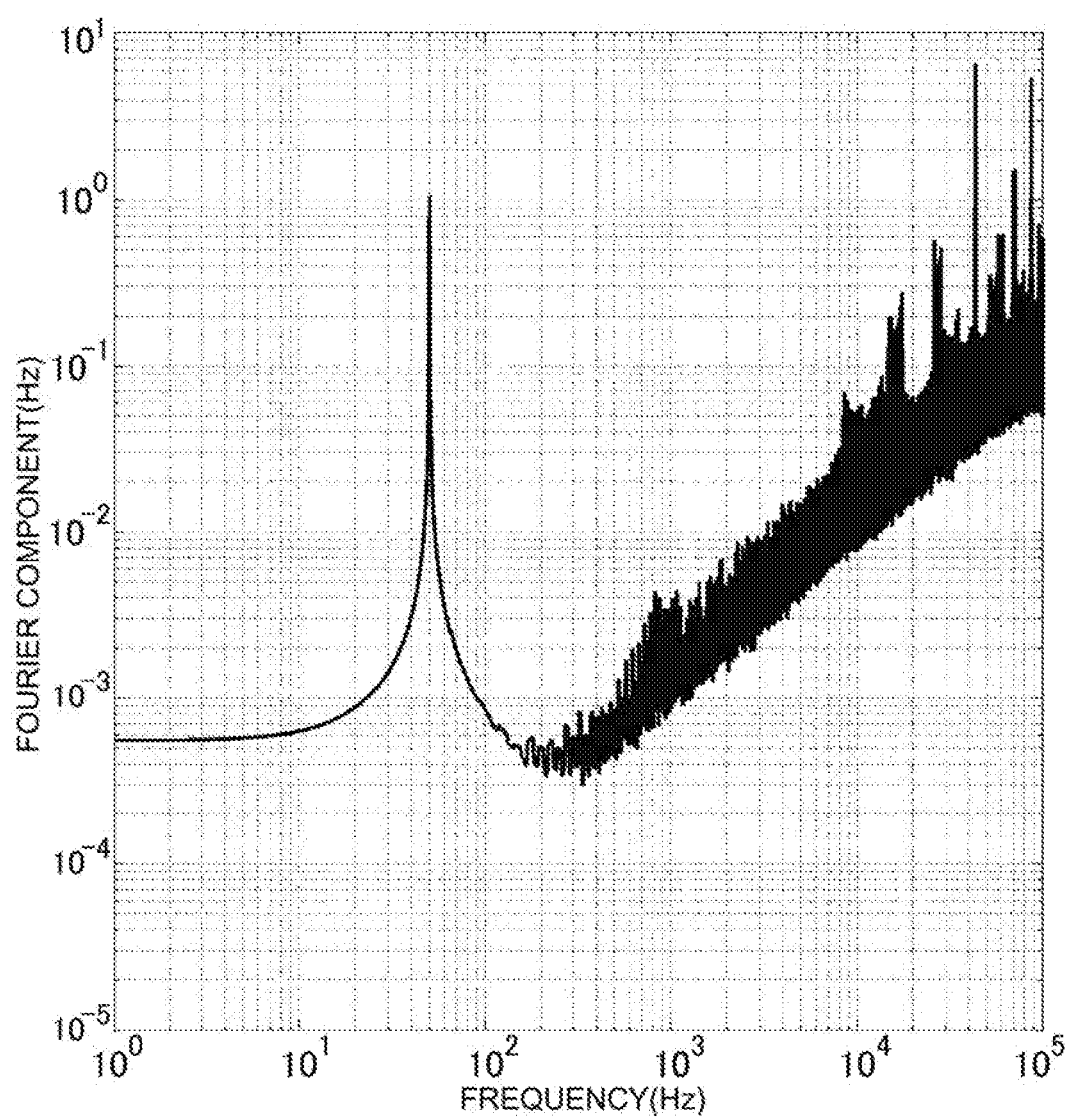
FIG. 21 is a diagram showing an example of a frequency characteristic of the delta-sigma modulated signal in the first configuration example.

It is possible to adjust the time series of the quantized value DQ according to a relation among the upper limit value of the state value ST, the threshold $VT_1$, the gain $k_0$, and the gain $k_1$. A frequency characteristic of the delta-sigma modulated signal DSMO changes according to the upper limit value of the state value ST, the threshold $VT_1$, the gain $k_0$, and the gain $k_1$. FIGS. 20 and 21 are diagrams showing examples of the frequency characteristic of the delta-sigma modulated signal DSMO output from the frequency ratio measurement device 1 in the first configuration example. Both of FIGS. 20 and 21 show frequency characteristics obtained by sampling the delta-sigma modulated signal DSMO at $2^{20}$ points and performing FFT of the delta-sigma modulated signal DSMO using, as the measured signal SIG, a signal obtained by frequency-modulating a 122 kHz carrier wave at a modulation frequency of 50 Hz and amplitude of 1 Hz and using a 60.8 MHz signal as the clock signal CLK. FIG. 20 shows a frequency characteristic obtained by setting the upper limit value of the state value ST to 64, setting the threshold $VT_1$ to 64, and setting both of the gain $k_0$ and the gain $k_1$ to 64. FIG. 21 shows a frequency characteristic obtained by setting the upper limit value of the state value ST to 64, setting the threshold $VT_1$ to 18, setting the gain $k_0$ to 64, and setting the gain $k_1$ to 22. Compared with the frequency characteristic shown in FIG. 20, the frequency characteristic shown in FIG. 21 has slightly large floor noise. However, spurious noise shifts to a high frequency and a band is expanded. Since the floor noise and the spurious noise change according to the upper limit value of the state value ST, the threshold $VT_1$, the gain $k_0$, and the gain $k_1$, for example, when a range of a frequency ratio of the clock signal CLK and the measured signal SIG is determined in advance, the upper limit value of the state value ST, the threshold $VT_1$, the gain $k_0$, and the gain $k_1$ should be set to appropriate values.

Measurement resolution for the phase difference between the clock signal CLK and the measured signal SIG by the time to digital converter 100 is higher as the upper limit value of the state value ST is larger. However, since the circuit size of the time to digital converter 100 is also increases, the upper limit value of the state value ST should be set to an appropriate value.

The measurement resolution for the phase difference between the clock signal CLK and the measured signal SIG by the time to digital converter 100 and the threshold $VT_1$ may be equal. Consequently, it is possible to realize, with a simple configuration, the frequency ratio measurement device 1 that outputs the delta-sigma modulated signal DSMO.

The measurement resolution for the phase difference between the clock signal CLK and the measured signal SIG by the time to digital converter 100 may be different. Consequently, it is possible to realize the frequency ratio measurement device 1 adjusted to reduce a noise level in a desired frequency band.

3. Second Configuration Example

Concerning the frequency ratio measurement device 1 in a second configuration example, the same components as the components in the first configuration example are denoted by the same reference numerals and signs and explanation of the components is omitted or simplified. Differences from the first configuration example are mainly explained.

Figure 22:
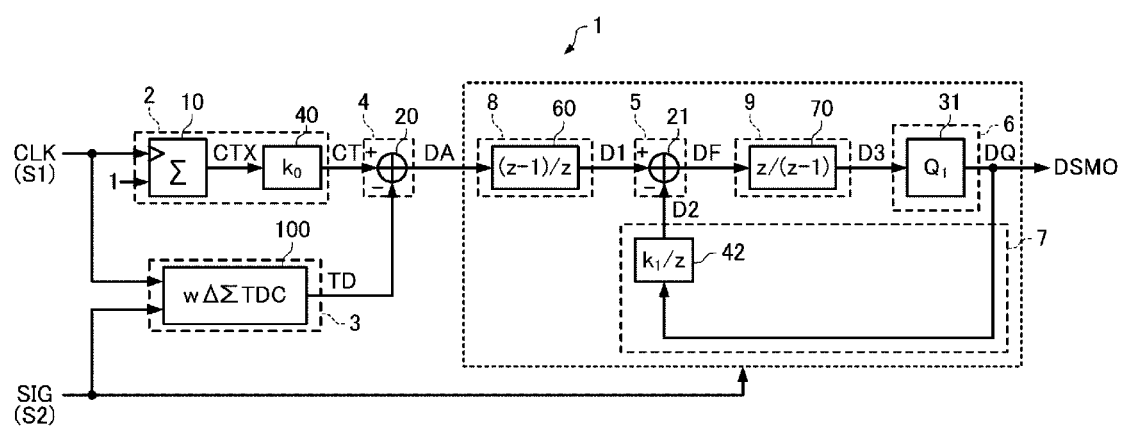
FIG. 22 is a diagram showing the frequency ratio measurement device in a second configuration example.

FIG. 22 is a diagram showing the configuration of the frequency ratio measurement device 1 in the second configuration example. In FIG. 22, the same components as the components shown in FIG. 2 are denoted by the same reference numerals and signs. As shown in FIG. 22, the frequency ratio measurement device 1 in the second configuration example includes the accumulator 10, the subtractor 20, the subtractor 21, the quantizer 31, the gain element 40, the delay gain element 42, a differentiator 60, an integrator 70, and the time to digital converter 100.

The accumulator 10 integrates 1 and outputs the count value CTX every time a time event occurs in the clock signal CLK.

The gain element 40 outputs the count value CT obtained by multiplying the count value CTX by $k_0$.

The time to digital converter 100 outputs the time digital value TD corresponding to a phase difference between the clock signal CLK and the measured signal SIG.

The subtractor 20 subtracts the time digital value TD from the count value CT and outputs the combined value DA.

The differentiator 60 differentiates the combined value DA and outputs the first value D1 based on a time event of the measured signal SIG. A notation of a differentiator by z-transform is "$(z-1)/z$".

Figure 23:
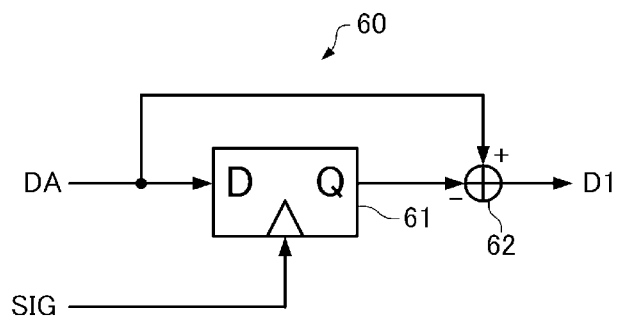
FIG. 23 is a diagram showing a specific configuration example of a differentiator.

FIG. 23 is a diagram showing a specific configuration example of the differentiator 60. As shown in FIG. 23, the differentiator 60 includes a register 61 and a subtractor 62. The register 61 is configured by, for example, one or a plurality of D-type flip flops. The register 61 captures and retains the combined value DA in synchronization with the time event of the measured signal SIG. The subtractor 62 subtracts a value retained by the register 61 from the combined value DA and outputs the first value D1.

Figure 24:
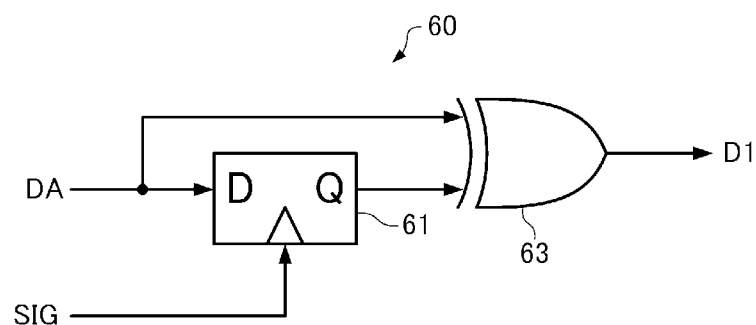
FIG. 24 is a diagram showing another specific configuration example of the differentiator.

FIG. 24 is a diagram showing another specific configuration example of the differentiator 60. As shown in FIG. 24, the differentiator 60 includes the register 61 and an exclusive OR circuit 63. The register 61 is configured by, for example, one or a plurality of D-type flip flops. The register 61 captures and retains a least significant bit of the combined value DA in synchronization with the time event of the measured signal SIG. The exclusive OR circuit 63 outputs, as the first value D1, a value of exclusive OR of the least significant bit of the combined value DA and the value retained by the register 61.

The differentiator 60 shown in FIG. 23 outputs a first value D1 equal to or larger than a binary value. The differentiator 60 shown in FIG. 24 outputs a first value D1, which is a binary value of 0 and 1.

Referring back to FIG. 22, the subtractor 21 subtracts, from the first value D1, the second value D2 output from the delay gain element 42 and outputs the difference value DF.

The integrator 70 integrates the difference value DF and outputs the third value D3 based on the time event of the measured signal SIG. A notation of an integrator by z-transform is "$z/(z-1)$".

Figure 25:
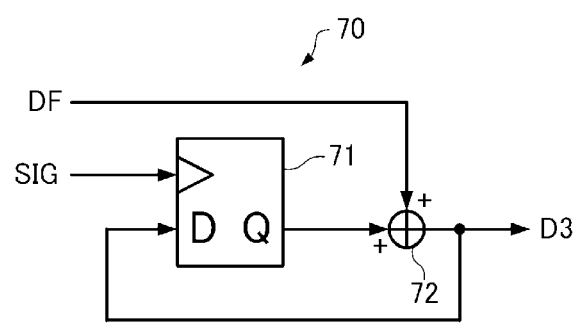
FIG. 25 is a diagram showing a specific configuration example of an integrator.

FIG. 25 is a diagram showing a specific configuration of the integrator 70. As shown in FIG. 25, the integrator 70 includes a register 71 and an adder 72. The register 71 is configured by, for example, one or a plurality of D-type flip flops. The register 71 captures and retains, in synchronization with the time event of the measured signal SIG, a value output from the adder 72. The adder 72 outputs, as the third value D3, a value obtained by adding up the difference value DF and a value retained by the register 71. In the example shown in FIG. 25, the integrator 70 integrates the difference value DF with the register 71 and the adder 72 in synchronization with the time event of the measured signal SIG and outputs the difference value DF as the third value D3 without a delay.

Referring back to FIG. 22, the quantizer 31 compares the third value D3 with the predetermined threshold $VT_1$ to thereby output the quantized value DQ obtained by quantizing the third value D3.

The delay gain element 42 multiplies the quantized value DQ by $k_1$ and delays the quantized value DQ and outputs the second value D2 based on the time event of the measured signal SIG, where $k_1$ is a positive number. The delay gain element 42 is configured by coupling a gain element and a delay device. A notation of the delay device by n-transport is "$1/z$".

In the frequency ratio measurement device 1 in the second configuration example configured as explained above, since the second value D2 based on the quantized value DQ is fed back, the delta-sigma modulated signal DSMO, which is a time series of the quantized value DQ, is a primary delta-sigma modulated signal.

In FIG. 22, the accumulator 10 and the gain element 40 are examples of the "counter section" and are equivalent to the counter section 2 shown in FIG. 1. The time to digital converter 100 is an example of the "time to digital converter section" and is equivalent to the time to digital converter section shown in FIG. 1. The subtractor 20 is an example of the "combiner section" and is equivalent to the combiner section 4 shown in FIG. 1. The subtractor is an example of the "subtractor section" and is equivalent to the subtractor section 5 shown in FIG. 1. The quantizer 31 is an example of the "quantizer section" and is equivalent to the quantizer section 6 shown in FIG. 1. The delay gain element 42 is an example of the "feedback section" and is equivalent to the feedback section 7 shown in FIG. 1. The differentiator 60 is an example of a "differentiator section" and is equivalent to the logic section 8 shown in FIG. 1. The integrator 70 is an example of an "integrator section" and is equivalent to the logic section 9 shown in FIG. 1.

The feedback section 7 only has to be configured to multiply the quantized value DQ by $k_1$ and delay the quantized value DQ and output the second value D2 based on the time event of the measured signal SIG. The order of the $k_1$ multiplication and the delay is optional.

Figure 26:
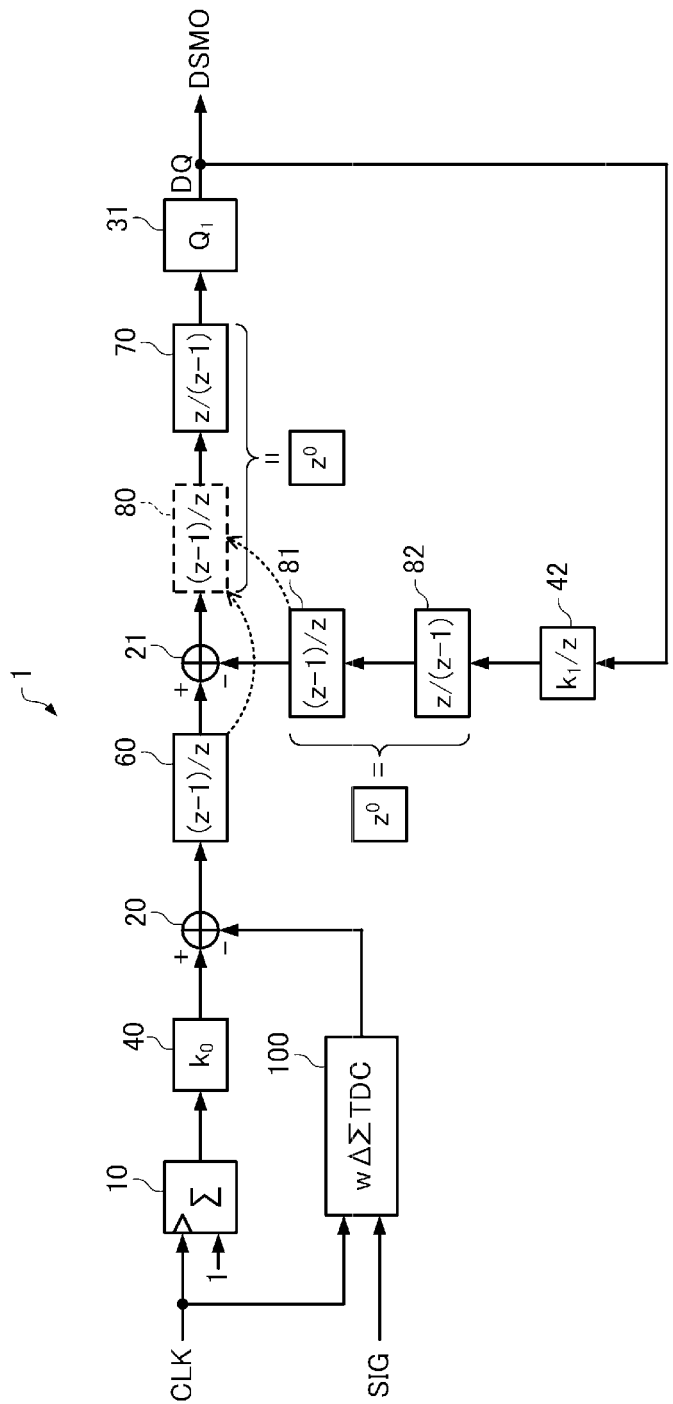
FIG. 26 is an explanatory diagram for explaining that the frequency ratio measurement device in the second configuration example is equivalent to the frequency ratio measurement device in the first configuration example.

The frequency ratio measurement device 1 in the second configuration example shown in FIG. 22 is equivalent to a configuration in which a differentiator 81 and an integrator 82 are added between the delay gain element 42 and the subtractor 21 as shown in FIG. 26. A configuration in which the differentiator 60 and the differentiator 81 are provided at a pre-stage of the subtractor 21 is equivalent to a configuration in which one differentiator 80 is provided at a post-stage of the subtractor 21. Further, the differentiator 80 and the integrator 70 are equivalent to $z^0$. Therefore, the frequency ratio measurement device 1 in the second configuration example is equivalent to the frequency ratio measurement device 1 in the first configuration example shown in FIG. 2 and achieves the same effects as the effects of the frequency ratio measurement device 1 in the first configuration example.

4. Third Configuration Example

Concerning the frequency ratio measurement device 1 in a third configuration example, the same components as the components in the first configuration example or the second configuration example are denoted by the same reference numerals and signs and explanation of the components is omitted or simplified. Differences from the first configuration example and the second configuration example are mainly explained.

Figure 27:
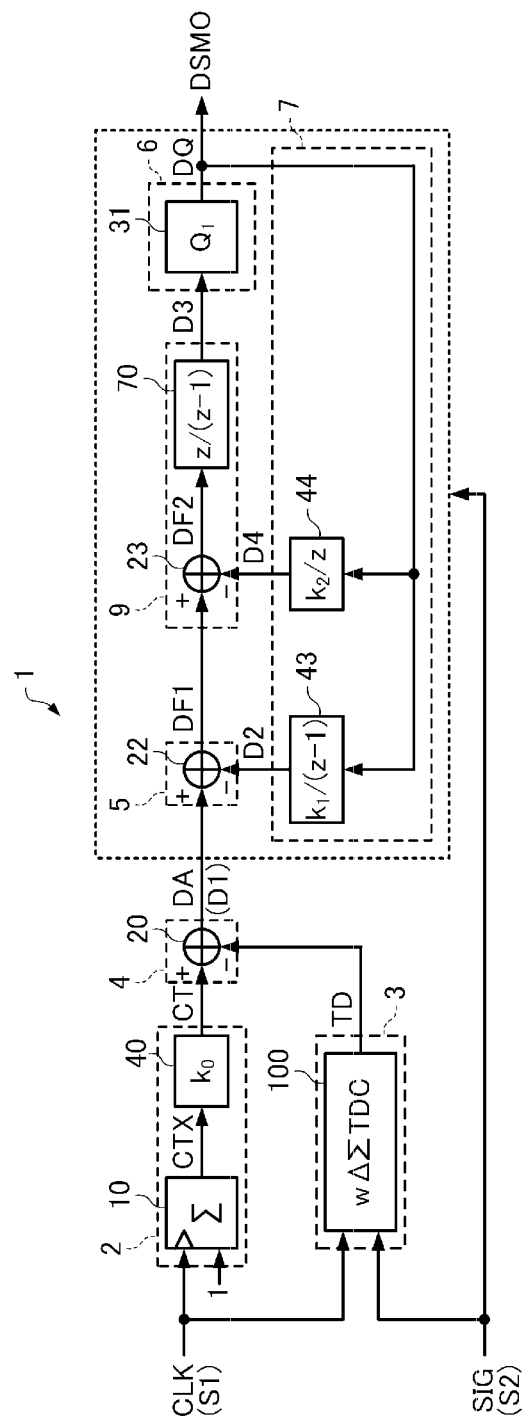
FIG. 27 is a diagram showing the frequency ratio measurement device in a third configuration example.

FIG. 27 is a diagram showing the configuration of the frequency ratio measurement device 1 in the third configuration example. In FIG. 27, the same components as the components shown in FIG. 2 or 22 are denoted by the same reference numerals and signs. As shown in FIG. 27, the frequency ratio measurement device 1 in the third configuration example includes the accumulator 10, the subtractor 20, a subtractor 22, a subtractor 23, the quantizer 31, the gain element 40, a gain and delay integrator 43, a delay gain element 44, the integrator 70, and the time to digital converter 100.

The accumulator 10 integrates 1 and outputs the count value CTX every time a time event of the clock signal CLK occurs.

The gain element 40 outputs the count value CT obtained by multiplying the count value CTX by $k_0$.

The time to digital converter 100 outputs the time digital value TD corresponding to a phase difference between the clock signal CLK and the measured signal SIG.

The subtractor 20 subtracts the time digital value TD from the count value CT and outputs the combined value DA.

The combined value DA output from the subtractor 20 is input to the subtractor 22 as the first value D1. The subtractor 22 subtracts, from the first value D1, the second value D2 output from the gain and delay integrator 43 and outputs a difference value DF1.

The subtractor 23 subtracts, from the difference value DF1, a fourth value D4 output from the delay gain element 44 and outputs a difference value DF2.

The integrator 70 integrates the difference value DF2 and outputs the third value D3 based on a time event of the measured signal SIG.

The quantizer 31 compares the third value D3 with the predetermined threshold $VT_1$ to thereby output the quantized value DQ obtained by quantizing the third value D3.

The gain and delay integrator 43 multiplies the quantized value DQ by $k_1$, integrates the quantized value DQ, and delays the quantized value DQ and outputs the second value D2 based on the time event of the measured signal SIG, where $k_1$ is a positive number.

The delay gain element 44 multiplies the quantized value DQ by $k_2$ and delays the quantized value DQ and outputs the fourth value D4 based on the time event of the measured signal SIG, where $k_2$ is a positive number.

In the frequency ratio measurement device 1 configured as explained above, the second value D2 and the fourth value D4 based on the quantized value DQ are fed back. Therefore, the delta-sigma modulated signal DSMO, which is a time series of the quantized value DQ, is a secondary delta-sigma modulated signal.

In FIG. 27, the accumulator 10 and the gain element 40 are examples of the "counter section" and are equivalent to the counter section 2 shown in FIG. 1. The time to digital converter 100 is an example of the "time to digital converter section" and is equivalent to the time to digital converter section 3 shown in FIG. 1. The subtractor 20 is an example of the "combiner section" and is equivalent to the combiner section 4 shown in FIG. 1. The subtractor is an example of a "first subtractor section" and is equivalent to the subtractor section 5 shown in FIG. 1. The subtractor 23 is an example of a "second subtractor section". The difference value DF1 is an example of a "first difference value" and is equivalent to the difference value DF shown in FIG. 1. The difference value DF2 is an example of a "second difference value". The quantizer 31 is an example of a "quantizer section" and is equivalent to the quantizer section 6 shown in FIG. 1. The gain and delay integrator 43 and the delay gain element 44 are examples of the "feedback section" and are equivalent to the feedback section 7 shown in FIG. 1. The integrator 70 is an example of the "integrator section". The subtractor 23 and the integrator 70 are equivalent to the logic section 9 shown in FIG. 1.

The feedback section 7 only has to be configured to multiply the quantized value DQ by $k_1$, integrate the quantized value DQ, and delay the quantized value DQ and output the second value D2 based on the time event of the measured signal SIG and further multiply the quantized value DQ by $k_2$ and delay the quantized value DQ and output the fourth value D4 based on the time event of the measured signal SIG. The order of $k_1$ multiplication, the integration, and the delay and the order of $k_2$ multiplication and the delay are optional.

Figure 28:
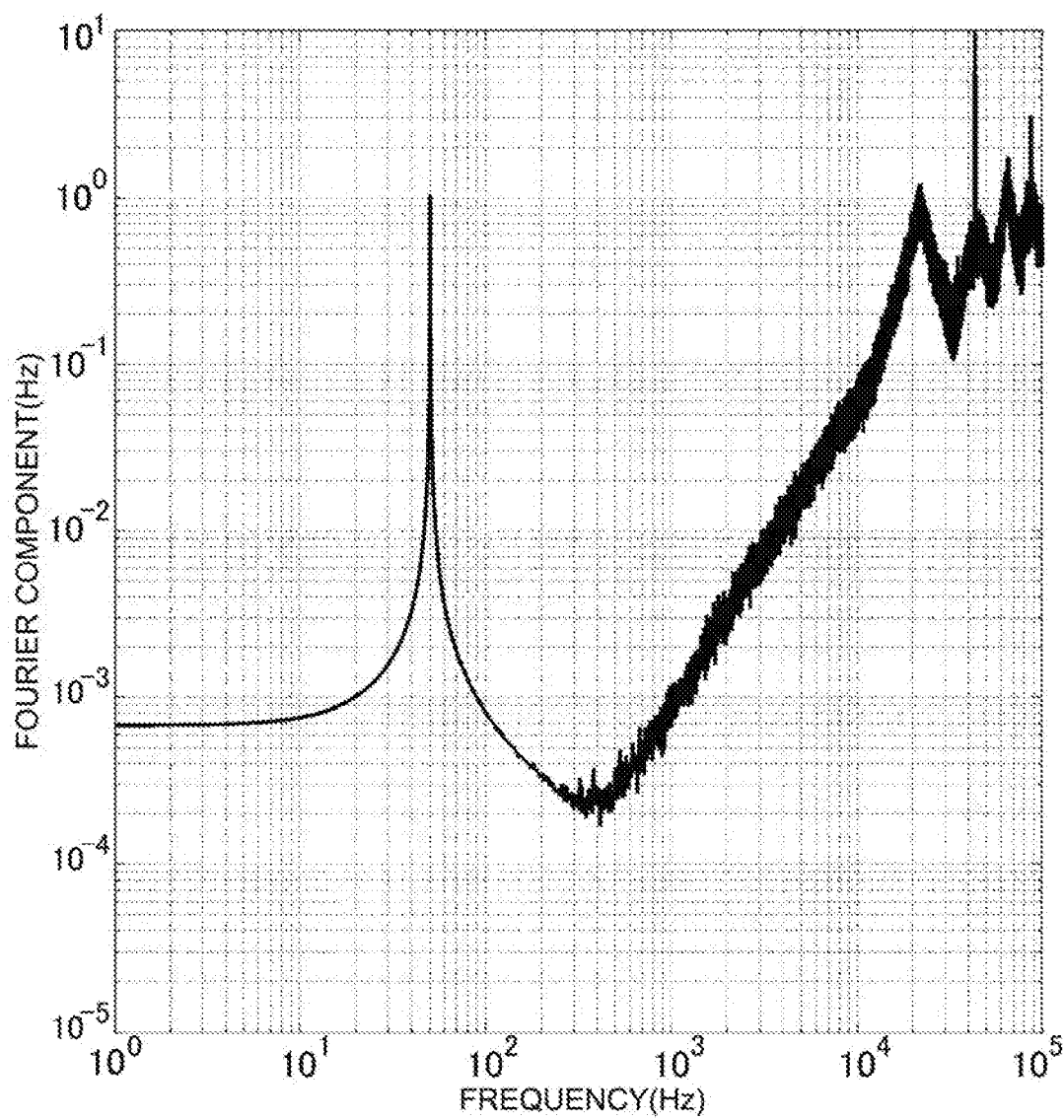
FIG. 28 is a diagram showing an example of a frequency characteristic of a delta-sigma modulated signal in the third configuration example.

FIG. 28 is a diagram showing an example of a frequency characteristic of the delta-sigma modulated signal DSMO output from the frequency ratio measurement device 1 in the third configuration example. FIG. 28 shows a frequency characteristic obtained by setting all of the upper limit value of the state value ST, the threshold $VT_1$ and the gains $k_0$, $k_1$, and $k_2$ to 32, sampling the delta-sigma modulated signal DSMO at $2^{20}$ points, and performing FFT of the delta-sigma modulated signal DSMO using, as the measured signal SIG, a signal obtained by frequency-modulating a 122 kHz carrier wave at a modulation frequency of 50 Hz and amplitude of 1 Hz and using a 60.8 MHz signal as the clock signal CLK. In the frequency characteristic shown in FIG. 28, when compared with FIGS. 20 and 21 showing the frequency characteristics of the primary delta-sigma modulated signal, a tilt of a noise shape is steep and floor noise in a measurement target frequency band decreases. Therefore, with the frequency ratio measurement device 1 in the third configuration example, it is possible to perform more highly accurate frequency ratio measurement than the frequency ratio measurement device 1 in the first configuration example and the second configuration example.

5. Fourth Configuration Example

Concerning the frequency ratio measurement device 1 in a fourth configuration example, the same components as the components in the first configuration example, the second configuration example, or the third configuration example are denoted by the same reference numerals and signs and explanation of the components is omitted or simplified. Differences from the first configuration example, the second configuration example, and the third configuration example are mainly explained.

Figure 29:
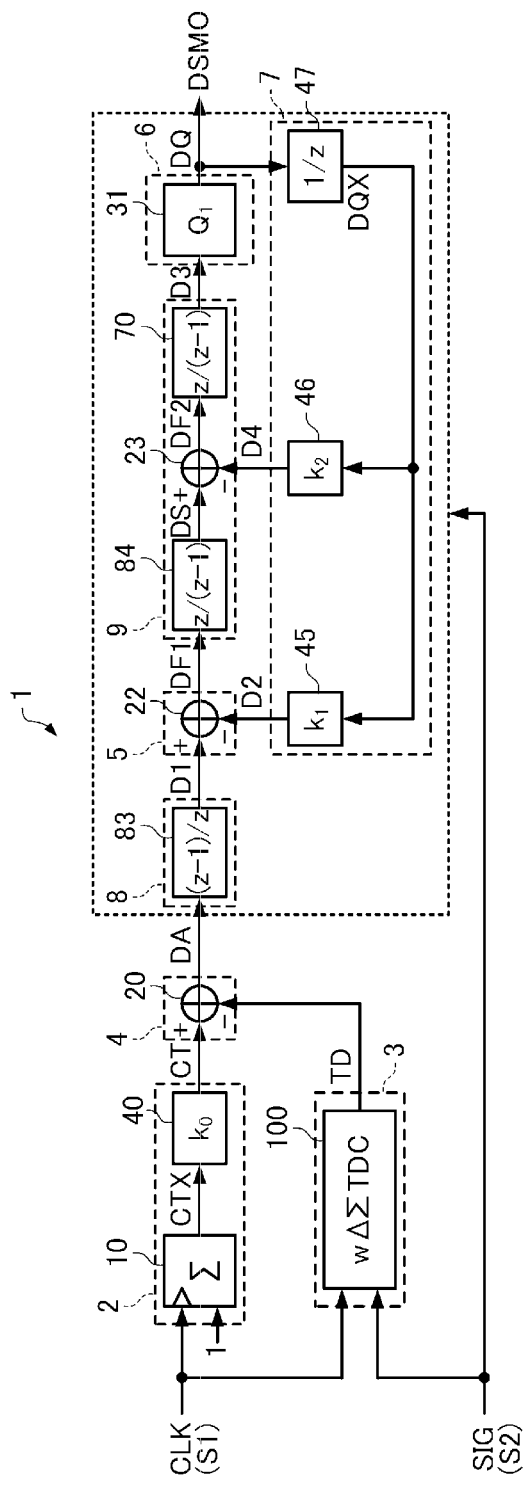
FIG. 29 is a diagram showing the frequency ratio measurement device in a fourth configuration example.

FIG. 29 is a diagram showing the configuration of the frequency ratio measurement device 1 in the fourth configuration example. In FIG. 29, the same components as the components shown in FIG. 2, 22, or 27 are denoted by the same reference numerals and signs. As shown in FIG. 29, the frequency ratio measurement device 1 in the fourth configuration example includes the accumulator 10, the subtractor 20, the subtractor 22, the subtractor 23, the quantizer 31, the gain element 40, a gain element 45, a gain element 46, a delay device 47, the integrator 70, a differentiator 83, an integrator 84, and the time to digital converter 100.

The accumulator 10 integrates 1 and outputs the count value CTX every time a time event of the clock signal CLK occurs.

The gain element 40 outputs the count value CT obtained by multiplying the count value CTX by $k_0$.

The time to digital converter 100 outputs the time digital value TD corresponding to a phase difference between the clock signal CLK and the measured signal SIG.

The subtractor 20 subtracts the time digital value TD from the count value CT and outputs the combined value DA.

The differentiator 83 differentiates the combined value DA and outputs the first value D1 based on a time event of the measured signal SIG.

The subtractor 22 subtracts, from the first value D1, the second value D2 output from the gain element 45 and outputs the difference value DF1.

The integrator 84 integrates the difference value DF1 and outputs the integrated value DS based on the time event of the measured signal SIG.

The subtractor 23 subtracts, from the integrated value DS, the fourth value D4 output from the gain element 46 and outputs the difference value DF2.

The integrator 70 integrates the difference value DF2 and outputs the third value D3 based on the time event of the measured signal SIG.

The quantizer 31 compares the third value D3 with the predetermined threshold $VT_1$ to thereby output the quantized value DQ obtained by quantizing the third value D3.

The delay device 47 delays the quantized value DQ and outputs the quantized value DQX based on the time event of the measured signal SIG.

The gain element 45 multiplies the quantized value DQX by $k_1$ and outputs the second value D2, where $k_1$ is a positive number.

The gain element 46 multiplies the quantized value DQX by $k_2$ and outputs the fourth value D4, where $k_2$ is a positive number.

In the frequency ratio measurement device 1 in the fourth configuration example configured as explained above, since the second value D2 and the fourth value D4 based on the quantized value DQ are fed back, the delta-sigma modulated signal DSMO, which is a time series of the quantized value DQ, is a secondary delta-sigma modulated signal.

In FIG. 29, the accumulator 10 and the gain element 40 are examples of the "counter section" and are equivalent to the counter section 2 shown in FIG. 1. The time to digital converter 100 is an example of the "time to digital converter section" and is equivalent to the time to digital converter section 3 shown in FIG. 1. The subtractor 20 is an example of the "combiner section" and is equivalent to the combiner section 4 shown in FIG. 1. The subtractor 22 is an example of the "first subtractor section" and is equivalent to the subtractor section 5 shown in FIG. 1. The subtractor 23 is an example of the "second subtractor section". The difference value DF1 is an example of the "first difference value" and is equivalent to the difference value DF shown in FIG. 1. The difference value DF2 is an example of the "second difference value". The quantizer 31 is an example of the "quantizer section" and is equivalent to the quantizer section 6 shown in FIG. 1. The gain element 45, the gain element 46, and the delay device 47 are examples of the "feedback section" and are equivalent to the feedback section 7 shown in FIG. 1. The differentiator 83 is an example of the "differentiator section" and is equivalent to the logic section 8 shown in FIG. 1. The integrator 84 is an example of a "first integrator section". The integrator 70 is an example of a "second integrator section". The integrator 84, the subtractor 23, and the integrator 70 are equivalent to the logic section 9 shown in FIG. 1.

The feedback section 7 only has to be configured to multiply the quantized value DQ by $k_1$ and delay the quantized value DQ and output the second value D2 based on the time event of the measured signal SIG and further multiply the quantized value DQ by $k_2$ and delay the quantized value DQ and output the fourth value D4 based on the time event of the measured signal SIG. The order of the $k_1$ multiplication and the delay and the order of the $k_2$ multiplication and the delay are optional.

Figure 30:
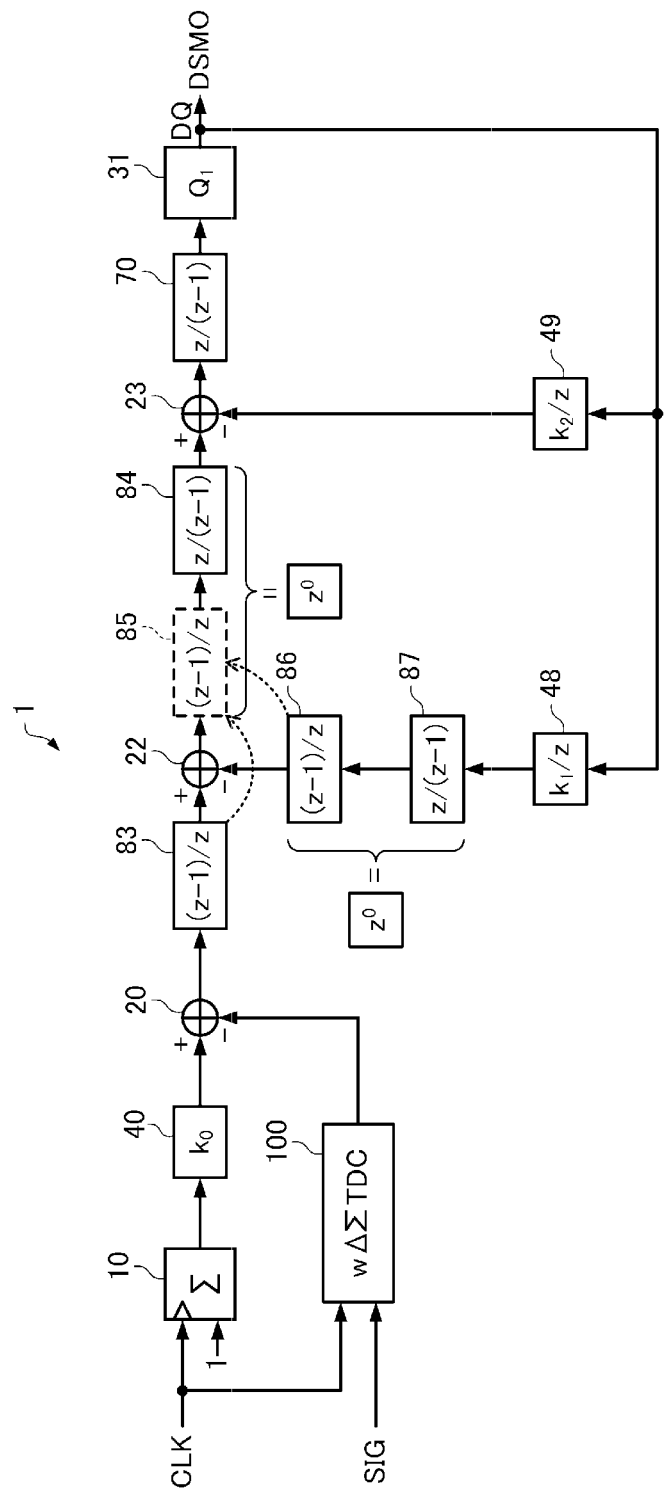
FIG. 30 is an explanatory diagram for explaining that the frequency ratio measurement device in the fourth configuration example is equivalent to the frequency ratio measurement device in the third configuration example.

The frequency ratio measurement device 1 in the fourth configuration example shown in FIG. 29 is equivalent to a configuration in which, as shown in FIG. 30, the delay device 47 and the gain element 45 are integrated as a delay gain element 48, the delay device 47 and the gain element are integrated as a delay gain element 49, and a differentiator 86 and an integrator 87 are added between the delay gain element 48 and the subtractor 22. A configuration in which the differentiator 83 and the differentiator 86 are provided at a pre-stage of the subtractor 22 is equivalent to a configuration in which one differentiator 85 is provided at a post-stage of the subtractor 22. Further, the differentiator 85 and the integrator 84 are equivalent to $z^0$. Therefore, the frequency ratio measurement device 1 in the fourth configuration example is equivalent to the frequency ratio measurement device 1 in the third configuration example shown in FIG. 27 and achieves the same effects as the effects of the frequency ratio measurement device 1 in the third configuration example.

6. Fifth Configuration Example

Concerning the frequency ratio measurement device 1 in a fifth configuration example, the same components as the components in the first configuration example, the second configuration example, the third configuration example, or the fourth configuration example are denoted by the same reference numerals and signs and explanation of the components is omitted or simplified. Differences from the first configuration example, the second configuration example, the third configuration example, and the fourth configuration example are mainly explained.

Figure 31:
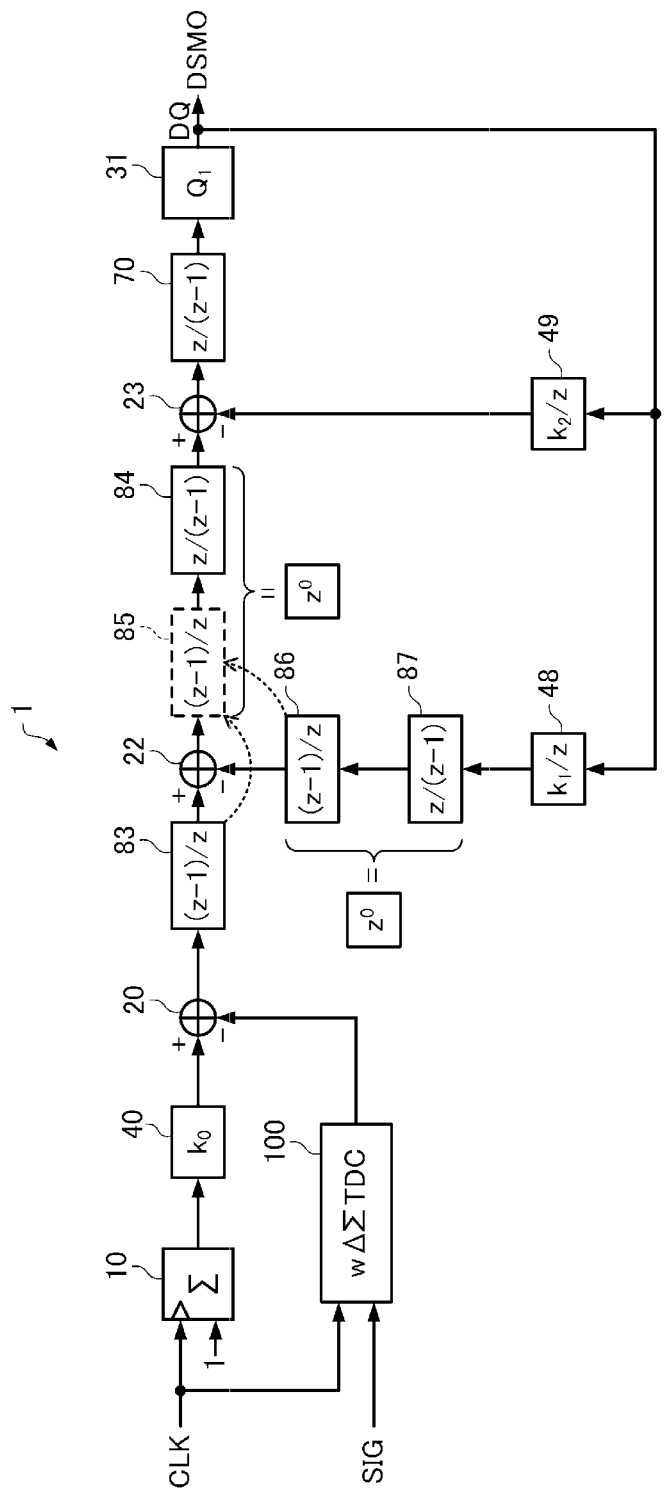
FIG. 31 is a diagram showing the frequency ratio measurement device in a fifth configuration example.

FIG. 31 is a diagram showing the configuration of the frequency ratio measurement device 1 in the fifth configuration example. In FIG. 31, the same components as the components shown in FIG. 2, 22, 27, or 29 are denoted by the same reference numerals and signs. As shown in FIG. 31, the frequency ratio measurement device 1 in the fifth configuration example includes the accumulator 10, the subtractor 20, the subtractor 21, the quantizer 31, the gain element 40, the gain element 41, the delay integrator 50, the time to digital converter 100, a first feedforward section 300-1, a second feedforward section 300-2, and a delta-sigma modulated signal generating section 301.

The gain element 40 outputs the count value CT obtained by multiplying the count value CTX by $k_0$.

The time to digital converter 100 outputs the time digital value TD corresponding to a phase difference between the clock signal CLK and the measured signal SIG.

The subtractor 20 subtracts the time digital value TD from the count value CT and outputs the combined value DA.

The combined value DA output from the subtractor 20 is input to the subtractor 21 as the first value D1. The subtractor 21 subtracts, from the first value D1, the second value D2 output from the delay integrator 50 and outputs the difference value DF. The difference value DF output from the subtractor 21 is input to the quantizer 31 as the third value D3. In FIG. 31, in order to clearly indicate that the third value D3 input to the quantizer 31 is a discrete value, a value of which is updated based on a time event of the measured signal SIG, a notation "$z^0$" by z-transform is inserted between the subtractor 21 and the quantizer 31.

The quantizer 31 compares the third value D3 with the predetermined threshold $VT_1$ to thereby output a first quantized value D121 obtained by quantizing the third value D3.

The gain element 41 outputs a quantized value $DQX_1$ obtained by multiplying the first quantized value D121 by $k_1$, where $k_1$ is a positive number.

The delay integrator 50 integrates the quantized value $DQX_1$ and delays the quantized value $DQX_1$ and outputs the second value D2 based on the time event of the measured signal SIG.

The first feedforward section 300-1 includes a subtractor 24, a subtractor 25, a quantizer 32, a gain element 88, an integrator 93, and a delay device 94.

The subtractor 24 subtracts the quantized value $DQX_1$ from the third value D3 and outputs a quantization error value $DQE_1$ corresponding to an error that occurs in the quantization by the quantizer 31.

The subtractor 25 outputs a value obtained by subtracting, from the quantization error value $DQE_1$, a value output from the delay device 94.

The integrator 93 integrates a value output from the subtractor 25 and outputs an integrated value $DS_1$ based on the time event of the measured signal SIG.

The quantizer 32 compares the integrated value $DS_1$ with a predetermined threshold $VT_2$ to thereby output a second quantized value $DQ_2$. In this way, the quantizer 32 quantizes the value based on the error, which occurs in the quantization by the quantizer 31, and outputs the second quantized value $DQ_2$.

The gain element 88 outputs a quantized value $DQX_2$ obtained by multiplying the second quantized value $DQ_2$ by $k_2$, where $k_2$ is a positive number.

The delay device 94 outputs, based on the time event of the measured signal SIG, a value obtained by delaying the quantized value $DQX_2$.

The second feedforward section 300-2 includes a subtractor 26, a subtractor 27, a quantizer 33, a gain element 89, an integrator 95, and a delay device 96.

The subtractor 26 subtracts the quantized value $DQX_2$ from the integrated value $DS_1$ and outputs a quantization error value $DQE_2$ corresponding to an error that occurs in the quantization by the quantizer 32.

The subtractor 27 outputs a value obtained by subtracting, from the quantization error value $DQE_2$, a value output from the delay device 96.

The integrator 95 integrates the value output from the subtractor 27 and outputs an integrated value DS2 based on the time event of the measured signal SIG.

The quantizer 33 compares the integrated value DS2 with a predetermined threshold $VT_3$ to thereby output a third quantized value $DQ_3$. In this way, the quantizer 33 quantizes the value based on the error, which occurs in the quantization by the quantizer 32, and outputs the third quantized value $DQ_3$.

The gain element 89 outputs a quantized value $DQX_3$ obtained by multiplying the third quantized value $DQ_3$ by $k_3$, where $k_3$ is a positive number.

The delay device 96 outputs, based on the time event of the measured signal SIG, a value obtained by delaying the quantize value $DQX_3$.

The delta-sigma modulated signal generating section 301 includes an adder 28, an adder 29, a differentiator 97, and a differentiator 98.

The differentiator 97 differentiates the third quantized value $DQ_3$ and outputs a differentiated value based on the time event of the measured signal SIG.

The adder 28 outputs a value obtained by adding up the second quantized value $DQ_2$ and the differentiated value output from the differentiator 97.

The differentiator 98 differentiates the value output from the adder 28 and outputs a differentiated value based on the time event of the measured signal SIG.

The adder 29 outputs a value obtained by adding up the first quantized value $DQ_1$ and the differentiated value output from the differentiator 98. A time series of the value output from the adder 29 is the delta-sigma modulated signal DSMO.

In this way, the delta-sigma modulated signal generating section 301 generates the delta-sigma modulated signal DSMO based on the first quantized value $DQ_1$, the second quantized value $DQ_2$, and the third quantized value $DQ_3$.

In the frequency ratio measurement device 1 in the fifth configuration example configured as explained above, the second value D2 based on the first quantized value $DQ_1$ is fed back and the quantized value $DQX_1$ and the quantized value $DQX_2$ are fed back. Therefore, the delta-sigma modulated signal DSMO is a tertiary delta-sigma modulated signal. Feedback control tends to be more unstable as order of a delta-sigma modulated signal input to the feedback section 7 is higher. However, with the frequency ratio measurement device 1 in the fifth configuration example, a time series of the first quantized value $DQ_1$ input to the feedback section 7 is a primary delta-sigma modulated signal and inputs to respective feedback loops of the first feedforward section 300-1 and the second feedforward section 300-2 at a post-stage are also primary delta-sigma modulated signals at most. Therefore, stable feedback control is performed and a highly accurate tertiary delta-sigma modulated signal DSMO is obtained.

In FIG. 31, the accumulator 10 and the gain element 40 are examples of the "counter section" and are equivalent to the counter section 2 shown in FIG. 1. The time to digital converter 100 is an example of the "time to digital converter section" and is equivalent to the time to digital converter section 3 shown in FIG. 1. The subtractor 20 is an example of the "combiner section" and is equivalent to the combiner section 4 shown in FIG. 1. The subtractor is an example of the "subtractor section" and is equivalent to the subtractor section 5 shown in FIG. 1. The quantizer 31 is an example of a "first quantizer section" and is equivalent to the quantizer section 6 shown in FIG. 1. The first quantized value $DQ_1$ is equivalent to the quantized value DQ shown in FIG. 1. The gain element 41 and the delay integrator 50 are examples of the "feedback section" and are equivalent to the feedback section 7 shown in FIG. 1. The quantizer 32 is an example of a "second quantizer section". The quantizer 33 is an example of a "third quantizer section".

In FIG. 31, the frequency ratio measurement device includes the first feedforward section 300-1 and the second feedforward section 300-2. However, the frequency ratio measurement device 1 may include first to M-th feedforward sections 300-1 to 300-M, where M is a natural number. A j-th feedforward section 300-j includes a quantizer, which is a j+1-th quantizer section, where j is any integer equal to or larger than 1 and equal to or smaller than M. The j+1-th quantizer section quantizes a value based on a quantization error included in a j-th quantized value $DQ_j$ and outputs a j+1-th quantized value $DQ_{j+1}$. The delta-sigma modulated signal generating section 301 generates the delta-sigma modulated signal DSMO based on the first quantized value $DQ_1$ to an M+1-th quantized value $DQ_{M+1}$.

FIG. 32 is a diagram showing an example of a frequency characteristic of the delta-sigma modulated signal DSMO output from the frequency ratio measurement device 1 in the fifth configuration example. FIG. 32 shows a frequency characteristic obtained by setting all of the upper limit value of the state value ST, the thresholds $VT_1$, $VT_2$, and $VT_3$, and the gains $k_0$, $k_1$, $k_2$, and $k_3$ to 32, sampling the delta-sigma modulated signal DSMO at $2^{20}$ points, and performing FFT of the delta-sigma modulated signal DSMO using, as the measured signal SIG, a signal obtained by frequency-modulating a 122 kHz carrier wave at a modulation frequency of 50 Hz and amplitude of 1 Hz and using a 60.8 MHz signal as the clock signal CLK. In FIG. 32, when compared with FIG. 28 showing the frequency characteristic of the secondary delta-sigma modulated signal, a tilt of a noise shape is steep and floor noise in a measurement target frequency band decreases. Therefore, with the frequency ratio measurement device 1 in the fifth configuration example, it is possible to perform more highly accurate frequency ratio measurement than the frequency ratio measurement device 1 in the third configuration example and the fourth configuration example.

The present disclosure is not limited to this embodiment. Various modified implementations are possible within the scope of the gist of the present disclosure.

For example, a part of the first configuration example may be replaced with a part of any one of the second configuration example to the fifth configuration example as appropriate. Similarly, a part of the second configuration example may be replaced with a part of any one of the first configuration example and the third configuration example to the fifth configuration example as appropriate. Similarly, a part of the third configuration example may be replaced with a part of any one of the first configuration example, the second configuration example, the fourth configuration example, and the fifth configuration example as appropriate. Similarly, a part of the fourth configuration example may be replaced with a part of any one of the first configuration example to the third configuration example and the fifth configuration example as appropriate. Similarly, a part of the fifth configuration example may be replaced with a part of any one of the first configuration example to the fourth configuration example as appropriate.

The embodiment and the modifications explained above are examples. The present disclosure is not limited to the embodiment and the modifications. For example, the embodiment and the modifications can be combined as appropriate.

The present disclosure includes substantially the same configuration as the configuration explained in the embodiment (for example, a configuration, a function, a method, and a result of which are the same as those in the embodiment or a configuration, a purpose, and an effect of which are the same as those in the embodiment). The present disclosure includes a configuration in which a nonessential portion of the configuration explained in the embodiment is replaced. The present disclosure includes a configuration that can accomplish the same action effects as the action effects explained in the embodiment or a configuration that can achieve the same purpose as the purpose of the embodiment. The present disclosure includes a configuration in which a publicly-known technique is added to the configuration explained in the embodiment.

What is claimed is:

1. A frequency ratio measurement device that outputs a delta-sigma modulated signal corresponding to a frequency ratio of a first signal and a second signal, the frequency ratio measurement device comprising:
   a counter section;
   a time to digital converter section;
   a combiner section;
   a subtractor section;
   a quantizer section; and
   a feedback section, wherein
   the counter section counts a time event of the first signal and outputs a count value obtained by multiplying the time event by $k_0$, where $k_0$ is a rational number,
   the time to digital converter section outputs a time digital value corresponding to a phase difference between the first signal and the second signal,
   the combiner section outputs a combined value of the count value and the time digital value,
   the subtractor section outputs a difference value between a first value based on the combined value and a second value output from the feedback section,
   the quantizer section compares a third value based on the difference value with a predetermined threshold to thereby output a quantized value obtained by quantizing the third value,
   the feedback section outputs, based on a time event of the second signal, the second value based on the quantized value, and
   the delta-sigma modulated signal is a signal based on the quantized value.

2. The frequency ratio measurement device according to claim 1, wherein
   the first value is the combined value, and
   the feedback section multiplies the quantized value by $k_1$, integrates the quantized value, and delays the quantized value and outputs the second value based on the time event of the second time, where $k_1$ is a positive number.

3. The frequency ratio measurement device according to claim 1, further comprising:
   a differentiator section; and
   an integrator section, wherein
   the differentiator section differentiates the combined value and outputs the first value based on the time event of the second signal,
   the integrator section integrates the difference value and outputs the third value based on the time event of the second signal, and
   the feedback section multiplies the quantized value by $k_1$ and delays the quantized value and outputs the second value based on the time event of the second signal, where $k_1$ is a positive number.

4. The frequency ratio measurement device according to claim 1, wherein
   the subtractor section is a first subtractor section,
   the difference value is a first difference value,
   the frequency ratio measurement device further comprises:
   a second subtractor section; and
   an integrator section,
   the first value is the combined value,
   the feedback section multiplies the quantized value by $k_1$, integrates the quantized value, and delays the quantized value and outputs the second value based on the time event of the second signal, where $k_1$ is a positive number, and further multiplies the quantized value by $k_2$ and delays the quantized value and outputs a fourth value based on the time event of the second signal, where $k_2$ is a positive number,
   the second subtractor section outputs a second difference value between the first difference value and the fourth value, and
   the integrator section integrates the second difference value and outputs the third value based on the time event of the second signal.

5. The frequency ratio measurement device according to claim 1, wherein
   the subtractor section is a first subtractor section,
   the difference value is a first difference value,
   the frequency ratio measurement device further comprises:

a second subtractor section;
a differentiator section;
a first integrator section; and
a second integrator section,
the differentiator section differentiates the combined value and outputs the first value based on the time event of the second signal,
the feedback section multiplies the quantized value by $k_1$ and delays the quantized value and outputs the second value based on the time event of the second signal, where $k_1$ is a positive number, and further multiplies the quantized value by $k_2$ and delays the quantized value and outputs a fourth value based on the time event of the second signal, where $k_2$ is a positive number,
the first integrator section integrates the first difference value and outputs an integrated value,
the second subtractor section outputs a second difference value between the integrated value and the fourth value, and
the second integrator section integrates the second difference value and outputs the third value based on the time event of the second signal.

6. The frequency ratio measurement device according to claim 1, wherein
the quantizer section is a first quantizer section,
the quantized value is a first quantized value,
the frequency ratio measurement device further comprises:
first to M-th feedforward sections, where M is a natural number; and
a delta-sigma modulated signal generating section configured to generate the delta-sigma modulated signal,
the j-th feedforward section includes a j+1-th quantizer section, where j is any integer equal to or large than 1 and equal to or smaller than M, and the j+1-th quantizer section quantizes a value based on an error that occurs in quantization by the j-th quantizer section and outputs a j+1-th quantized value, and
the delta sigma modulated signal generator section generates the delta-sigma modulated signal based on the first to M+1-th quantized values.

7. The frequency ratio measurement device according to claim 1, wherein measurement resolution for the phase difference by the time to digital converter section and the threshold are equal.

8. The frequency ratio measurement device according to claim 1, wherein measurement resolution for the phase difference by the time to digital converter section and the threshold are different.

* * * * *